(12) United States Patent
Woods et al.

(10) Patent No.: US 7,450,245 B2
(45) Date of Patent: Nov. 11, 2008

(54) METHOD AND APPARATUS FOR MEASURING HIGH-BANDWIDTH ELECTRICAL SIGNALS USING MODULATION IN AN OPTICAL PROBING SYSTEM

(75) Inventors: Gary Woods, Sunnyvale, CA (US);
Steven Kasapi, San Francisco, CA (US);
Kenneth Wilsher, Palo Alto, CA (US)

(73) Assignee: DCG Systems, Inc., Fremont, CA (US)

( * ) Notice: Subject to any disclaimer, the term of this patent is extended or adjusted under 35 U.S.C. 154(b) by 0 days.

(21) Appl. No.: 11/436,267

(22) Filed: May 17, 2006

(65) Prior Publication Data

US 2007/0002328 A1    Jan. 4, 2007

Related U.S. Application Data

(63) Continuation-in-part of application No. 11/169,423, filed on Jun. 29, 2005, and a continuation-in-part of application No. 11/261,996, filed on Oct. 27, 2005.

(60) Provisional application No. 60/711,998, filed on Aug. 26, 2005.

(51) Int. Cl.
*G01B 9/02* (2006.01)
(52) U.S. Cl. ...................... 356/484; 356/369
(58) Field of Classification Search ................. 356/491, 356/369, 484
See application file for complete search history.

(56) References Cited

U.S. PATENT DOCUMENTS 3,524,694 A    8/1970   Klein et al.
3,711,186 A    1/1973   O'Connor
3,912,378 A   10/1975   Goto
4,297,032 A   10/1981   Temple
T102,104 I4    8/1982   Kirk et al.
4,353,618 A   10/1982   Hagner et al.
4,555,767 A   11/1985   Case et al.
4,588,950 A    5/1986   Henley
4,615,620 A   10/1986   Noguchi et al.
4,625,114 A   11/1986   Bosacchi et al.
4,634,234 A    1/1987   Baumann
4,680,635 A    7/1987   Khurana
4,681,449 A    7/1987   Bloom et al.
4,698,587 A   10/1987   Burns et al.

(Continued)

OTHER PUBLICATIONS

Paniccia, Mario, et al., "Novel Optical Probing Technique for Flip Chip Packaged Microprocessors," International Test Conference, IEEE 1998.

(Continued)

*Primary Examiner*—Samuel A Turner
(74) *Attorney, Agent, or Firm*—Nixon Peabody LLP; Joseph Bach, Esq.

(57) ABSTRACT

A system for probing a DUT is provided, the system comprising a tunable or CW laser source, a modulator for modulating the output of the laser source, a beam optics designed to point a probing beam at a designated location on the DUT, optical detector for detecting the reflected beam, and collection and signal processing electronics. The system deciphers perturbations in the reflected beam by detecting beat frequency between operation frequency of the DUT and frequency of the modulation. In an alternative embodiment, the laser is CW and the modulation is applied to the optical detector.

32 Claims, 13 Drawing Sheets

U.S. PATENT DOCUMENTS

| | | | |
|---|---|---|---|
| 4,721,910 | A | 1/1988 | Bokor et al. |
| 4,724,322 | A | 2/1988 | Knowles et al. |
| 4,736,159 | A | 4/1988 | Shiragasawa et al. |
| 4,758,092 | A | 7/1988 | Heinrich et al. |
| 4,758,786 | A | 7/1988 | Hafeman |
| 4,811,090 | A | 3/1989 | Khurana |
| 4,908,568 | A | 3/1990 | Gerald |
| 4,956,603 | A | 9/1990 | Russo |
| 4,968,932 | A | 11/1990 | Baba et al. |
| 5,004,307 | A | 4/1991 | Kino et al. |
| 5,010,945 | A | 4/1991 | Burke |
| 5,012,100 | A * | 4/1991 | Plies et al. ............... 250/342 |
| 5,087,121 | A | 2/1992 | Kakuchi et al. |
| 5,124,635 | A * | 6/1992 | Henley ..................... 324/754 |
| 5,164,664 | A * | 11/1992 | Soelkner .................. 324/752 |
| 5,208,648 | A | 5/1993 | Batchelder et al. |
| 5,220,403 | A | 6/1993 | Batchelder et al. |
| 5,247,392 | A | 9/1993 | Plies |
| 5,282,088 | A | 1/1994 | Davidson |
| 5,334,540 | A | 8/1994 | Ishii |
| 5,412,328 | A | 5/1995 | Male et al. |
| 5,430,305 | A | 7/1995 | Cole, Jr. et al. |
| 5,453,994 | A | 9/1995 | Kawamoto et al. |
| 5,457,536 | A | 10/1995 | Kornfield et al. |
| 5,465,043 | A * | 11/1995 | Sakai ....................... 324/753 |
| 5,475,316 | A | 12/1995 | Hurley et al. |
| 5,493,236 | A | 2/1996 | Ishii et al. |
| 5,532,607 | A | 7/1996 | Inuzuka et al. |
| 5,532,873 | A | 7/1996 | Dixon |
| 5,854,804 | A | 12/1998 | Winer et al. |
| 5,872,360 | A | 2/1999 | Paniccia et al. |
| 5,905,577 | A * | 5/1999 | Wilsher et al. ............. 324/752 |
| 5,930,588 | A | 7/1999 | Paniccia |
| 5,940,545 | A | 8/1999 | Kash et al. |
| 6,072,179 | A | 6/2000 | Paniccia et al. |
| 6,168,311 | B1 | 1/2001 | Xiao et al. |
| 6,251,706 | B1 | 6/2001 | Paniccia |
| 6,252,222 | B1 * | 6/2001 | Kasapi et al. .............. 324/752 |
| 6,252,412 | B1 | 6/2001 | Talbot et al. |
| 6,462,814 | B1 | 10/2002 | Lo |
| 6,509,750 | B1 | 1/2003 | Talbot et al. |
| 6,591,121 | B1 | 7/2003 | Madarasz et al. |
| 6,594,086 | B1 | 7/2003 | Pakdaman et al. |
| 6,605,951 | B1 | 8/2003 | Cowan |
| 6,621,275 | B2 | 9/2003 | Cotton et al. |
| 6,720,588 | B2 | 4/2004 | Vickers |
| 6,778,327 | B2 | 8/2004 | Pakdaman et al. |
| 6,788,396 | B2 | 9/2004 | Stolte et al. |
| 6,797,581 | B2 | 9/2004 | Vickers |
| 6,798,562 | B2 | 9/2004 | Hakimi et al. |
| 6,812,464 | B1 | 11/2004 | Sobolewski et al. |
| 6,836,131 | B2 | 12/2004 | Cader et al. |
| 6,897,664 | B1 | 5/2005 | Bruce et al. |
| 6,963,402 | B2 * | 11/2005 | Chism, II .................. 356/369 |

OTHER PUBLICATIONS

Eiles, Travis M., et al., "Optical Probing oF VLSI IC's from the Silicon Backside," *Proceedings from the 25th International Symposium for Testing and Failure Analysis*, Nov. 14-18, 1999, pp. 27-33.

Bruce, Mike, et al., "Waveform Acquisition from the Backside of Silicon Using Electro-Optic Probing," *Proceedings from the 25th International Symposium for Testing and Failure Analysis*, Nov. 14-18, 1999, pp. 19-25.

Heinrich, H.K., et al., "Picosecond Backside Optical Detection of Internal Signals in Flip-Chip Mounted Silicon VLSI Circuits," *3rd European Conference on Electron and Optical Beam Testing of Integrated Circuits*, Sep. 9-11, 1991, Como, Italy.

Black, A., et al., "Optical Sampling of GHz Charge Density Modulation in Silicon Bipolar Junction Transistors," Electronics Letters, 1987, vol. 23, No. 15, p. 783-784.

Kasapi, Steven, et al., "Laser Beam Backside Probing of CMOS Integrated Circuits," *Microelectronics Reliability*, 1999, pp. 957-961, 39.

Heinrich, H.K., et al., "Noninvasive Sheet Charge Density Probe for Integrated Silicon Devices," *Appl. Phys. Lett.* 48 (16), Apr. 21, 1986, American Institute of Physics.

Heinrich, H.K., et al., "Erratum: Noninvasive Sheet Charge Density Probe for Integrated Silicon Devices," *Appl. Phys. Lett.*. 1986, 48, 1066.

Heinrich, H.K., et al., "Noninvasive Optical Sheet Charge Density Probe for Silicon Integrated Circuits," *IEEE Transactions on Electron Devices*, Nov. 1986, vol. Ed. 33 No. 11.

Hemenway, B.R., et al., "Optical Detection of Charge Modulation in Silicon Integrated Circuits Using a Multimode Laser-Diode Probe," *IEEE Electron Device Letters*, Aug. 1987, vol. EdL-8, No. 8.

Soref, Richard A., et al., "Electrooptical Effects in Silicon," *IEEE Journal of Quantum Electronics*, Jan. 1987, Vol. QE-23 No. 1.

Wilsher, Kenneth R., et al., "Practical Optical Waveform Probing of Flip-Chip CMOS Devices," *ITC International Test Conference*, Paper 35.1, 1999.

Wilsher, Ken, et al., "Integrated Circuit Waveform Probing Using Optical Phase Shift Detection," *Proceedings from the 26th International Symposium for Testing and Failure Analysis*, Nov. 12-16, 2000, pp. 479-485, Bellevue, Washington.

Lo, William, et al., "Polarization Difference Probing: A New Phase Detection Scheme for Laser Voltage Probing," *Proceedings from the 30th International Symposium for Testing and Failure Analysis*, Nov. 14-18, 2004, Worcester, Massachusetts.

Heinrich, H.K., "Picosecond Noninvasive Optical Detection of Internal Electrical Signals in Flip-Chip-Mounted Silicon Integrated Circuits," *IBM J. Res. Development*, Mar./May 1990, vol. 34, No. 2/3.

Mertin, W., et al., "Contactless Gigahertz Testing," Gerhard-Mercator-Universität Duisburg, (1989).

Buller, G.S., et al., "All-Solid-State Microscope-Based System for Picosecond Time-Resolved Photoluminescence Measurements on II-VI Semiconductors," *Rev. Sci. Instrum.* 63 (5), May 1992, American Institute of Physics.

Charbonneau, S., et al., "Two-Dimensional Time-Resolved Imaging with 100-ps Resolution Using a Resistive Anode Photomultiplier Tube," *Rev. Sci. Instrum.*, 63 (11), Nov. 1992, American Institute of Physics.

Buller, G.S., et al., "Time-resolved Photoluminescence Measurements of InGaAs/InP Multiple-Quantum-Well Structures at 1.3-μm Wavelengths By Use of Germanium Single-Photon Avalanche Photodiodes," *Applied Optics*, Feb. 20, 1996, pp. 916-921, vol. 35, No. 6.

Kudva, S.M., "The Sematech Failure Analysis Roadmap," *ISTFA '95, 21st International Symposium for Testing and Failure Analysis*, Nov. 6-10, 1995, pp. 1-5, Santa Clara, California.

Restle Philip, et al., "Internal Probing of Submicron FETs and Photoemission Using Individual Oxide Traps," *IBM Journal of Research and Development*, Mar./May 1990, pp. 227-241, vol. 34, No. 2/3.

Cole, Edward I., Jr., et al., "Novel Failure Analysis Techniques Using Photo Probing With a Scanning Optical Microscope," *IEEE/IRPS*, 1994, pp. 388-398.

Esfahani, Farzad, et al., "Testability Improvement of Highly Integrated Circuits by Optical Injection of Logical Levels into the Circuit," Institut für Mikroelektronik, Technische Universität Berlin, pp. 288-295, (1997).

Bergner, H., et al., "Dynamic Laser Beam Testing of a n-MOS Device," *Microelectronic Engineering*, 15 (1991), pp. 109-112, Elsevier Science Publishers B.V.

Bergner, Harald, et al., "A Time-Resolved Optical Beam Induced Current Method," *Microelectronic Engineering*, 12 (1990), pp. 143-148, Elsevier Science Publishers B.V.

Bergner, H., et al., "Identification of Hot Spots in Integrated Circuits by Laser Scanning Microscopy," *Microelectronic Engineering*, 14 (1991), pp. 121-131, Elsevier Science Publishers, B.V.

Nikawa, K., et al., "Verification and Improvement of the Optical Beam Induced Resistance Change (OBIRCH) Method," *Proceedings of the 20th International Symposium for Testing and Failure Analysis*, Nov. 13-18, 1994, pp. 11-16.

Nikawa, Kiyoshi, et al., "LSI Failure Analysis Using Focused Laser Beam Heating," p. 307-312, (1997).

Nikawa, Kiyoshi, et al., "New VLSI Failure Analysis Method Using Infrared Laser Beam." (1996) Abstract.

Nikawa, Kiyoshi, et al., "Various Contrast Identifiable from the Backside of a Chip by 1.3μm Laser Beam Scanning and Current Change Imaging," *Proceedings ISTFA*, Nov. 20, 1996, pp. 1-6.

Nikawa, Kiyoshi, et al., "New Laser Beam Heating Methods Applicable to Fault Localization and Defect Detection in VLSI Devices," *IEEE*, 1996, pp. 346-354.

Xu, Chris, et al., "Two-Photon Beam Induced Current (OBIC) Imaging Through the Backside of Integrated Circuits," Murray Hill, New Jersey, (1997).

Gutkin, A.A., et al., "Influence of the Orientation of the Electric Field on the Polarization Dependence of on the Electroabsorption in Silicon," *Soviet Physics Semiconductors*, Dec. 1974, pp. 781-782, vol. 8, No. 6.

Gutkin, A.A., et al., "Influence of the Polarization of Light on the Electroabsorption in Silicon," *Soviet Physics—Semiconductors*, Mar. 1973, pp. 1524-1527, vol. 6, No. 9.

Fan, H.Y., et al., "Infra-Red Absorption of Silicon," *Letters to the Editor*, Feb. 24, 1950, p. 178.

Duckworthy, Henry E., et al., "Masses of $Cr^{50}$, $Cr^{52}$, and $Fe^{54}$," *Letters to the Editor*, Feb. 28, 1950, p. 179.

Chester, Marvin, et al., "Electroabsorption Spectrum in Silicon," *Physical Review Letters*, Aug. 10, 1964, pp. 193-195, vol. 13, No. 6.

Anderson, P.W., et al., "Radio-Frequency Effects in Superconducting Thin Film Bridges," *Physical Review Letters*, Aug. 10, 1964, vol. 13, No. 6.

Redfield, David, "Effect of Defect Fields on the Optical Absorption Edge," *Physical Review*, May 1, 1963, pp. 916-918, vol. 130, No. 3.

Frova, A., et al., "Electro-Absorption Effects at the Band Edges of Silicon and Germanium," *Physical Review*, May 13, 1966, pp. 575-583, vol. 145, No. 2.

Valdmanis, Janis A., et al., "Subpicosecond Electrical Sampling," *IEEE Journal of Quantum Electronics*, Apr. 1983, pp. 664-667, vol. QE-19, No. 4.

Löffler, T., et al., "Stable Optoelectronic Detection of Free-Running Microwave Signals with 150-GHz Bandwidth," *Microelectronic Engineering*, 1996, pp. 397-408, 31, Elsevier Science B.V.

Heinrich, H.K., et al., "Measurement of Real-Time Digital Signals in a Silicon Bipolar Junction Transistor Using a Noninvasive Optical Probe," *IEEE Electronics Letters*, Jun. 5, 1986, pp. 650-652, vol. 22, No. 12.

Falk, Dr. R. Aaron, "IVT Imagery," OptoMetrix, Inc., (1996).

Kash, J.A., et al., "Full Chip Optical Imaging of Logic State Evolution in CMOS Circuits," *IEDM*, 1996, Late News Paper.

Tsang, J.C., et al., "Picosecond Hot Electron Light Emission from Sub-Micron Complementary Metal Oxide Semiconductor Circuits," *Applied Physics Letters*, Feb. 17, 1997, 70(7), American Institute of Physics.

Kume, H., et al., "Ultrafast Microchannel Plate Photomultipliers," *Applied Optics*, Mar. 15, 1988, pp. 1170-1178, vol. 27, No. 6.

Khurana, N., et al., "Analysis of Product Hot Electron Problems by Gated Emission Microscopy," *IEEE/IRPS*, 1986, pp. 189-194.

Weingarten, Kurt J., et al., "Picosecond Optical Sampling of GaAs Integrated Circuits," *IEEE Journal of Quantum Electronics*, Feb. 1988, pp. 198-205, vol. 24, No. 2.

Kolachina, S., et al., "Optical Waveform Probing—Strategies for Non-Flipchip Devices and Other Applications," *Conference Proceedings from the 27th International Symposium for Testing and Failure Analysis (ISFTA)*, Nov. 11-15, 2001, pp. 51-57.

Yee, W.M., et al., "Laser Voltage Probe (LVP): A Novel Optical Probing Technology for Flip-Chip Packaged Microprocessors," *Conference Proceedings from the 26th International Symposium for Testing and Failure Analysis (ISFTA)* Nov. 12-16, 2000, pp. 3-8.

* cited by examiner

METHOD AND APPARATUS FOR MEASURING HIGH-BANDWIDTH ELECTRICAL SIGNALS USING MODULATION IN AN OPTICAL PROBING SYSTEM

CROSS-REFERENCE TO RELATED APPLICATION

This application is a continuation-in-part of, and claims the benefit of priority from, U.S. patent application Ser. No. 11/169,423, filed on Jun. 29, 2005, the entire disclosure of which is relied upon and incorporated by reference herein. This application is also a continuation-in-part of, and claims the benefit of priority from, U.S. patent application Ser. No. 11/261,996, filed on Oct. 27, 2005, which claims the benefit of priority from Provisional Patent Application No. 60/711,998 filed on Aug. 26, 2005, the entire disclosures of which are relied upon and incorporated by reference herein.

BACKGROUND

1. Field of the Invention

The present invention relates to an apparatus and method for probing integrated circuits using laser illumination.

2. Description of the Related Art

Probing systems have been used in the art for testing and debugging integrated circuit (IC) designs and layouts. Various laser-based systems for probing IC's are known in the prior art. While some description of the prior art is provided herein, the reader is encouraged to also review U.S. Pat. Nos. 5,208,648, 5,220,403 and 5,940,545, which are incorporated herein by reference in their entirety. Additional related information can be found in Yee, W. M., et al. *Laser Voltage Probe (LVP): A Novel Optical Probing Technology for Flip-Chip Packaged Microprocessors*, in International Symposium for Testing and Failure Analysis (ISTFA), 2000, p 3-8; Bruce, M. et al. *Waveform Acquisition from the Backside of Silicon Using Electro-Optic Probing*, in International Symposium for Testing and Failure Analysis (ISTFA), 1999, p 19-25; Kolachina, S. et al. *Optical Waveform Probing—Strategies for Non-Flipchip Devices and Other Applications*, in International Symposium for Testing and Failure Analysis (ISTFA), 2001, p 51-57; Soref, R. A. and B. R. Bennett, *Electrooptical Effects in Silicon*. IEEE Journal of Quantum Electronics, 1987. QE-23(1): p. 123-9; Kasapi, S., et al., *Laser Beam Backside Probing of CMOS Integrated Circuits*. Microelectronics Reliability, 1999. 39: p. 957; Wilsher, K., et al. *Integrated Circuit Waveform Probing Using Optical Phase Shift Detection*, in International Symposium for Testing and Failure Analysis (ISTFA), 2000, p 479-85; Heinrich, H. K., *Picosecond Noninvasive Optical Detection of Internal Electrical Signals in Flip-Chip-Mounted Silicon Integrated Circuits*. IBM Journal of Research and Development, 1990. 34(2/3): p. 162-72; Heinrich, H. K., D. M. Bloom, and B. R. Hemenway, *Noninvasive sheet charge density probe for integrated silicon devices*. Applied Physics Letters, 1986. 48(16): p. 1066-1068; Heinrich, H. K., D. M. Bloom, and B. R. Hemenway, *Erratum to Noninvasive sheet charge density probe for integrated silicon devices*. Applied Physics Letters, 1986. 48(26): p. 1811; Heinrich, H. K., et al., *Measurement of real-time digital signals in a silicon bipolar junction transistor using a noninvasive optical probe*. IEEE Electron Device Letters, 1986. 22(12): p. 650-652; Hemenway, B. R., et al., *Optical detection of charge modulation in silicon integrated circuits using a multimode laser-diode probe*. IEEE Electron Device Letters, 1987. 8(8): p. 344-346; A. Black, C. Courville, G Schultheis, H. Heinrich, *Optical Sampling of GHz Charge Density Modulation in Silicon Bipolar Junction Transistors* Electronics Letters, 1987, Vol. 23, No. 15, p. 783-784, which are incorporated herein by reference in their entirety.

As is known, during debug and testing of an IC, a commercially available Automated Testing Equipment, also known as an Automated Testing and Evaluation (ATE) tester, is used to generate test patterns (also referred to as test vectors) to be applied to the IC device under test (DUT). When a laser-based system is used for probing, the DUT is illuminated by the laser and the light reflected from the DUT is collected by the probing system. As the laser beam strikes the DUT, the laser beam is modulated by the response of various elements of the DUT to the test vectors. This has been ascribed to the electrical modulation of the free carrier density, and the resultant perturbation of the index of refraction, of the material. Accordingly, analysis of the reflected light provides information about the operation of various devices in the DUT.

FIG. 1 is a general schematic depicting major components of a laser-based voltage probe system architecture, 100, according to the prior art. In FIG. 1, dashed arrows represent optical path, while solid arrows represent electronic signal path. The optical paths represented by curved lines are generally made using fiber optic cables. Probe system 100 comprises a laser source which, in this particular example, is a dual laser source, DLS 110, an optical bench 112, and data acquisition and analysis apparatus 114. The optical bench 112 includes provisions for mounting the DUT 160. A conventional ATE tester 140 provides stimulus signals and receives response signals 142 to/from the DUT 160 and provides trigger and clock signals, 144, to the time-base board 155. The time-base board 155 synchronizes the signal acquisition with the DUT stimulus and the laser pulses. Workstation 170 controls as well as receives, processes, and displays data from the signal acquisition board 150, time-base board 155, and the optical bench 112.

The various elements of probe system 100 will now be described in more detail. Since temporal resolution is of high importance in testing DUT's, the embodiment of FIG. 1 utilizes prior art pulsed lasers, wherein the laser pulse width determines the temporal resolution of the system. Dual laser source 110 consists of two lasers: a pulsed mode-locked laser, MLL 104, source that is used to generate 10-35 ps wide pulses, and a continuous-wave laser source, CWL 106, that can be externally gated to generate approximately 1 µs wide pulses. The MLL 104 source runs at a fixed frequency, typically 100 MHz, and must be synchronized with the stimulus 142 provided to the DUT 160, via a phase-locked loop (PLL) on the time-base board 155, and the trigger and clock signals 144 provided by the ATE tester. The output of the DLS 110 is transmitted to the optical bench 112 using fiber optics cable 115. The light beam is then manipulated by beam optics 125, which directs the light beam to illuminate selected parts of the DUT 160. The beam optics 125 consists of a Laser Scanning Microscope (LSM 130) and beam manipulation optics (BMO 135). The specific elements that are conventional to such an optics setup, such as objective lens, etc., are not shown. Generally, BMO 135 consists of optical elements necessary to manipulate the beam to the required shape, focus, polarization, etc., while the LSM 130 consists of elements necessary for scanning the beam over a specified area of the DUT. In addition to scanning the beam, the LSM 130 has vector-pointing mode to direct the laser beams to anywhere within the field-of-view of the LSM and Objective Lens. The X-Y-Z stage 120 moves the beam optics 125 relative to the stationary DUT 160. Using the stage 120 and the vector-pointing mode of the LSM 130, any point of interest on the DUT 160 may be illuminated and probed.

For probing the DUT 160, the ATE 140 sends stimulus signals 142 to the DUT, in synchronization with the trigger and clock signals provided to the phase-locked loop on the time-base board 155. The phase-lock loop controls the MLL 104 to synchronize its output pulses to the stimulus signals 142 to the DUT. MLL 104 emits laser pulses that illuminate a particular device of interest on the DUT that is being stimulated. The reflected light from the DUT is collected by the beam optics 125, and is transmitted to photodetector 138 via fiber optic cable 134. The reflected beam changes character depending on the reaction of the device to the stimulus signal. To monitor incident laser power, for purposes of compensating for laser power fluctuations, for example, optical bench 112 provides means to divert a portion of MLL 104 incident pulse to photodetector 136 via fiber optic cable 13. The output signal of the photosensors 132, 134 is sent to signal acquisition board 150, which, in turn, sends the signal to the controller 170. By manipulation of the phase lock loop on the time-base board 155, controller 170 controls the precise time position of MLL 104 pulses with respect to DUT 160 stimulus signals 142. By changing this time position and monitoring the photosensors signals, the controller 170 can analyze the temporal response of the DUT to the stimulus signals 142. The temporal resolution of the analysis is dependent upon the width of the MLL 104 pulse.

While the arrangement depicted in FIG. 1 has been used successfully in the art, the system has several drawbacks. From the usability and performance perspective, the phase-lock requirement puts restrictions on the usable DUT stimulus trigger and clock periods. This is a burden to the user because it prevents the user from testing at arbitrary clock frequencies and it requires additional setup by the user. Additionally, noise rejection performance is dependent upon the signal-processing algorithm. Optimizing this algorithm is difficult. From the economic perspective, the MLL is expensive, and custom electronics and software must be developed. The CWL source is also custom built to give the best vibration noise rejection, and its output must match the MLL in wavelength and spectral width. All these custom elements increase the complexity and the overall cost of the system.

A major difficulty encountered by all laser-base probe systems is deciphering the weak modulation in the reflected signal, which is caused by the response of the DUT to the stimulus. Another difficulty is noise introduced into the signal by the DUT's vibrations. Various beam manipulation optic, 135, designs have been used in the art in an attempt to solve these difficulties. FIG. 2 is a diagram illustrating standard amplitude detection mode used in the prior art. In FIG. 2, a laser probe is used to probe specific device 210, such as a transistor's gate or drain, in a DUT. A beam splitter 220 is used to separate the reflected beam from the incident laser beam. Amplitude modulation due to DUT interaction with the laser beam can be detected directly using a photodetector. However, DUT vibrations cause amplitude variations that are much stronger than the variation from the DUT activity of interest. This necessitates noise rejection schemes to make such an arrangement practical. One scheme implemented in the prior art is dual-laser noise rejection. In dual-laser noise rejection, the pulses from CWL 106 are used to measure the DUT 160 vibrations. The CWL measurements are then used to normalize the MLL measurements of the DUT activity.

The DUT interaction with the laser beam may cause changes mostly in the phase of the reflected laser beam, not its amplitude. Consequently, the signal strength may be too weak for pure amplitude detection. Various phase detection schemes have been developed for the beam manipulation optics 135. FIG. 3 is a diagram illustrating a phase detection scheme using a Michelson Interferometer arrangement to convert phase to amplitude. This scheme is also referred to as Phase-Interferometric Detection, or PID, mode. To detect phase modulations, a portion of the incident beam from the laser source is directed into a reference arm consisting of a lens 340 and a mirror 330, using beam splitter 320. The remaining portion of the incident beam is directed to a specific device of interest on the DUT, and upon reflection it is modulated according to the DUT's response to a stimulus signal. The light beam, 355, reflected by the DUT, and the light beam, 335, reflected by the reference arm mirror 330, are spatially recombined into a single beam 365 so that they can interfere (light beams 355 and 335 are shown spatially separated in FIG. 3 for illustrative purposes). The interference effect converts relative phase differences between the reflected beam 355 and the reference arm beam 335 into amplitude differences in resultant beam 365, which can then be detected by a photodetector.

While this arrangement helps detect phase variations caused by the DUT, using this optical arrangement exposes the system to additional noise source from phase variations caused by DUT vibrations. The DUT vibrations still modulate reflected DUT beam amplitude, but now also modulate the DUT beam phase, which generates larger resultant beam 365 amplitude modulations. To compensate for this phase noise, a modified dual-laser noise rejection scheme is used. In this modified scheme, the CWL resultant signal is used in a feedback loop to control reference arm mirror 330 position. By striving to maintain constant CWL resultant signal, the feedback loop drives reference arm mirror 330 to track DUT vibrations in order to maintain a constant quiescent phase offset value between DUT and reference arms. Fine control of mirror 330 position for the feedback loop is provided via a piezo electric transducer element (not shown). Additional adjustments (not shown) that are required in order to get best performance include reference arm power control and coarse reference arm mirror position control. Reference arm power control allows the reflected power from the DUT and reference arm mirror to be matched. Coarse reference arm mirror position control allows DUT and reference arm optical path lengths to be nominally equalized, a necessity for the operation of the modified dual-laser noise reduction scheme due to wavelength differences between MLL and CWL used in the prior art. Means to align optics to ensure overlap of reflected DUT and reference arm beams are also necessary for best performance.

FIG. 4 is a diagram illustrating another scheme, generally known as (spatial) differential probing (SDP) for phase detection. A Wollaston prism, contained within beam manipulation optics 430, is used to generate the two spatially separated beams, 422, 424. The two beams, 422 and 424, have orthogonal, linear polarization states (denoted by the dots and arrows of beams 424 and 422, respectively). One beam, e.g., 422, is directed to the DUT active device of interest; while the other beam, say, 424, can be directed to either an inactive device or region, or to an active device with complementary modulation. The advantage of the latter option is that the measured signal modulation is increased because the relative phase modulation between the two beams is doubled. In the particular example of FIG. 4, the two beams are directed to the drains of the p- and n-FETs of an inverter, which generates complementary modulations of the beam. Beam manipulation optics 430 spatially recombines the two reflected beams, 435, 455, and converts them to the same polarization state so that they may interfere with each other to generate amplitude modulated resultant beam 465. Beam manipulation optics 430 also provides means to introduce a phase offset between the two beams so that the interference condition can be optimized for maximum signal sensitivity. Using this scheme the phase noise is reduced relative to the scheme illustrated in FIG. 3, because each beam is directed at the DUT, so that the DUT vibrations will tend to modulate the phase of both beams similarly.

As can be understood, various IC's have different layouts, and different devices within an IC's have different dimensions and surroundings. Therefore, using this embodiment, for each device to be probed the user needs to decide where to place each beam within the chip. Moreover, since the beam needs to be placed at various locations in the chip, the system needs to be designed so that the beam separation is adjustable, which complicates the optics design. Additionally, the intensity ratio of the beams must be variable since the reflectivity of the regions where they are placed can differ. Power matching between the two beams is required for best results.

Experience with devices as depicted in FIG. 4 has shown that DUT vibrations can still generate amplitude fluctuations if the two laser beams are not incident on identical structures. Due to variations in the layout and dimensions of the DUT, it is difficult to find identical structures for probing within the range of adjustment of the two laser beams. Differences in structure cause differences in reflection as the DUT is vibrated. To reduce the effects of these vibrations, the dual-laser noise reduction scheme can be used. However, the different polarization states of the two beams also makes them respond differently to time-varying birefringence in the DUT or in the optics of the system. Time varying birefringence in the DUT can be caused by stress variations due to mechanical vibrations, for example.

FIG. 5 is a diagram illustrating time differential probing (TDP) scheme for phase detection. Two pulsed beams, 522 and 524, are generated by splitting a single pulse beam in two and time shifting one relative to the other by a small amount (approx. 10-100 ps) before DUT interaction. Time shifting can be achieved by passing one beam through an optical delay line (such as a thick piece of glass) contained within beam manipulation optics, 526. The two beams are spatially recombined after splitting so that they traverse a common path to the DUT. After DUT reflection, the opposite beam is passed through the optical delay line to remove the relative delay between the two beams. The two beams are then allowed to interfere, 530. Since the two beams traverse a common path, DUT vibrations largely modulate both identically, making this scheme inherently vibration insensitive. However, the optics required to generate the delay, and then reverse its effect for the reflected beams, are relatively complicated. Additionally, the beams are not completely identical. They have orthogonal polarization states so DUT interactions are not truly identical (birefringence effects can cause non-common mode variations of the beams). In this scheme, the resulting 'waveforms' are derivatives of the signal at the probed device in the DUT and typically consist of positive and negative going peaks in the case of probed logic signals, for example. When both beams are position in time on logic highs or lows, the resultant beam intensity is the same since both beams are phase shifted identically in each case. Only when the time shifted beams span a logic transition (one beam on a logic high, the other beam on a logic low) or part of a logic transition, does a phase difference result. This arrangement requires high temporal resolution of the sampling to ensure that each logic transition of interest is spanned by the time separated beams. This can limit the maximum time span of a sampling window that can be used, or may require additional acquisition time to fill the desired sampling window with enough density of sampling points. In addition, the temporal resolution (or measurement bandwidth) of this scheme is limited by the pulse separation used instead of by the width of the laser pulses. Since larger pulse separations typically give better signal strength, this scheme suffers from a measurement bandwidth versus signal strength trade-off.

In addition to the difficulties introduced by the faint signal, another difficulty is caused by the advancement of the clock signal of modern circuits. That is, since modern circuits operate at high clock speeds, probing also needed to be performed at high clock speeds. Consequently, while cost and operations considerations dictate for simplifying the system and preferably simplifying the laser source, the high frequency operation of the modern circuit dictate for even higher complexity. Therefore, a solution is needed to enable obviating the mode-lock laser source, while providing the ability to detect signals at high operating frequency.

Accordingly, there is a need in the art for a system that will allow improved laser probing of a DUT at high frequency, while simplifying operation and minimizing the system's complexity and cost.

SUMMARY

Various embodiments of the present invention provide apparatus and method for laser probing of a DUT at very high temporal resolution, while enabling use of a conventional tunable or continuous wave (CW) laser source.

In one aspect of the invention, a system for probing a DUT is provided, the system comprising a tunable or CW laser source, a modulator for modulating the output of the laser source, a beam optics designed to point a probing beam at a designated location on the DUT, optical detector for detecting the reflected beam, and collection and signal processing electronics.

In another aspect of the invention, a system for probing a DUT is provided, the system comprising a CW laser source, a modulator for modulating the output of the laser source, the modulator modulating the laser output at the same frequency of the DUT clock frequency, a beam optics designed to point a probing beam at a designated location on the DUT, optical detector for detecting the reflected beam, and collection and signal processing electronics.

In yet another aspect of the invention, a system for probing a DUT is provided, the system comprising a tunable or CW laser source, a modulator for modulating the output of the laser source, the modulator modulating the laser output at the same frequency of the DUT clock frequency and in phase with the DUT, a beam optics designed to point a probing beam at a designated location on the DUT, optical detector for detecting the reflected beam, and collection and signal processing electronics.

In a further aspect of the invention, a system for probing a DUT is provided, the system comprising a tunable or CW laser source, a modulator for modulating the output of the laser source, the modulator modulating the laser output at the same frequency of the DUT clock frequency, but out of phase with the DUT, a beam optics designed to point a probing beam at a designated location on the DUT, optical detector for detecting the reflected beam, and collection and signal processing electronics.

In various illustrative implementations the beam optics comprise a common-path polarization differential probing (PDP) optics. The common-path PDP optics divides the laser beam into two beams of orthogonal polarization—one beam simulating a reference beam while the other simulating a probing beam. Both reference and probing beams are pointed to the same location on the DUT. Due to the intrinsic asymmetry of a CMOS transistor, the interaction of the reference and probing beams with the DUT result in different phase modulation in each beam. This difference can be investigated to study the response of the DUT to the stimulus signal.

Various embodiments of the invention also provide for a Laser Scanning Microscope (LSM) operable in a scanning mode and a vector-pointing mode. The scanning mode is used to obtain an image of an area of the DUT for navigation purposes, while the vector-pointing mode is used to park the beam on a specific device for probing.

In another embodiment of the invention, a system for testing an integrated circuit (IC) stimulated to simulate operating conditions is provided. The system includes a navigation light path and a probing light path. A first illumination source is used in the navigation mode to obtain an image of a specified area of the DUT via the navigation light path. Then, the light path is switched to the probing mode and a second light source is used to probe the DUT. The second light source is a laser light source providing a modulated laser beam, and the probing light path may include the common-path PDP optics. The probing light path may further include a solid immersion lens (SIL).

According to one aspect of the invention, a system for testing an integrated circuit microchip using laser probing is provided, which comprises a laser source providing a modulated laser beam; a beam optics receiving the modulated laser beam and providing a first and a second orthogonally polarized beams; a beam pointing optics receiving the first and second orthogonally polarized beams and pointing the first and second orthogonally polarized beams onto the same point on the microchip; a first photodetector receiving reflected laser light that is reflected from the microchip and providing an electrical signal; collection electronics receiving the electrical signal from the photodetector and providing an output signal; and an analysis system receiving and analyzing the output signal.

According to another aspect of the invention, a method of testing an integrated circuit microchip is provided, the method comprising generating a modulated laser beam; transferring the modulated laser beam through optical elements so as to point the modulated beam at a selected area on the microchip; and collecting and analyzing reflected light that is reflected from the selected area.

According to yet another aspect of the invention, an interferometer system is provided, comprising a laser source providing a modulated laser beam; a polarizer polarizing the modulated laser beam in a first direction; a Faraday rotator rotating the beam to align the polarization in a second direction, so as to effectively produce a first polarized beam aligned in said first direction and a second polarized beam aligned in a third direction that is orthogonal to the first direction; an optical retarder, retarding one of the first and second polarized beams; and an objective lens directing the first and second polarized beams onto a common point on a specimen.

Other aspects and features of the invention will become apparent from the description of various embodiments described herein, and which come within the scope and spirit of the invention as claimed in the appended claims.

Figure 1:
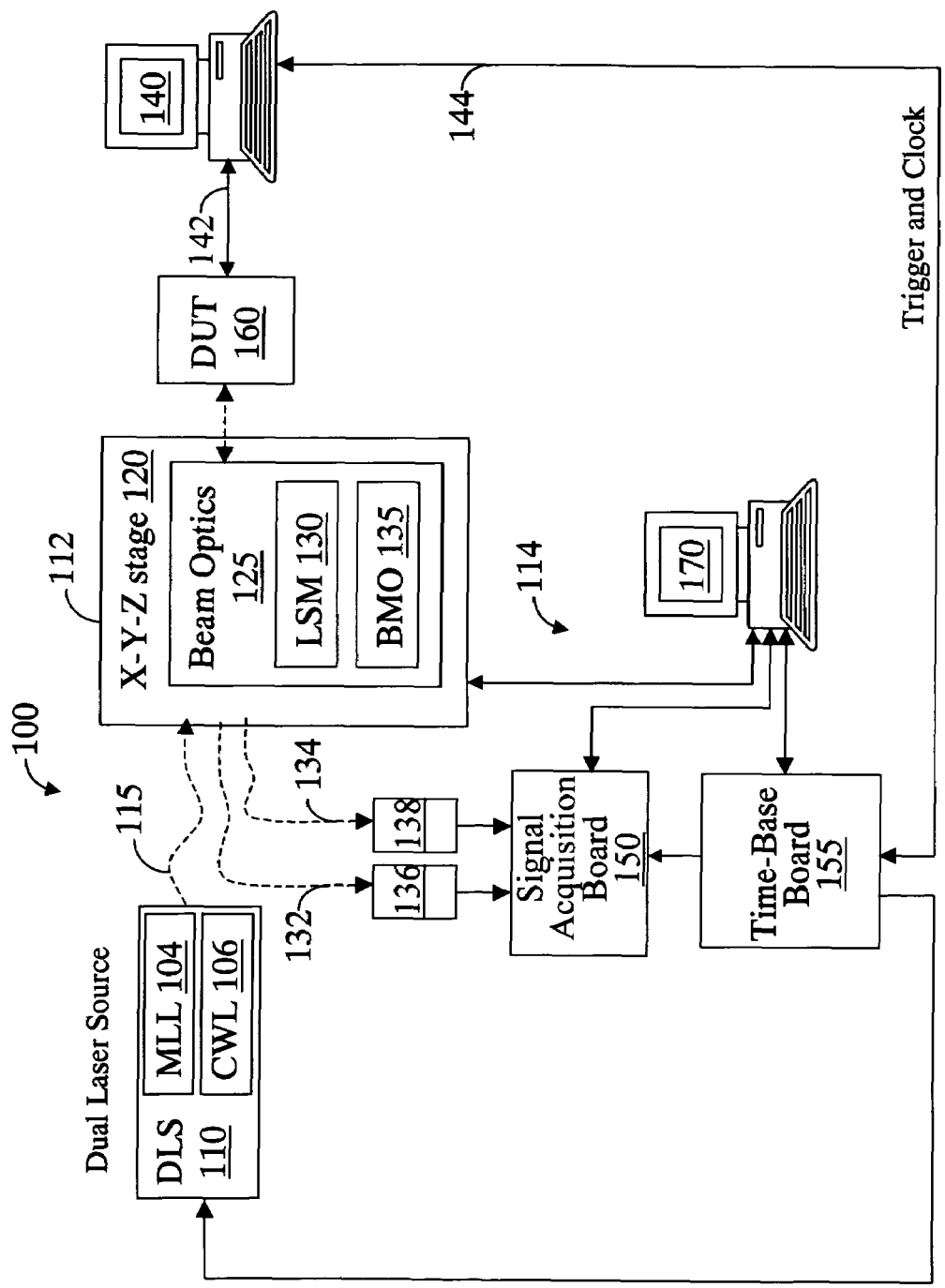
FIG. 1 is a general schematic depicting major components of a laser-based voltage probe system architecture according to the prior art.
Figure 3:
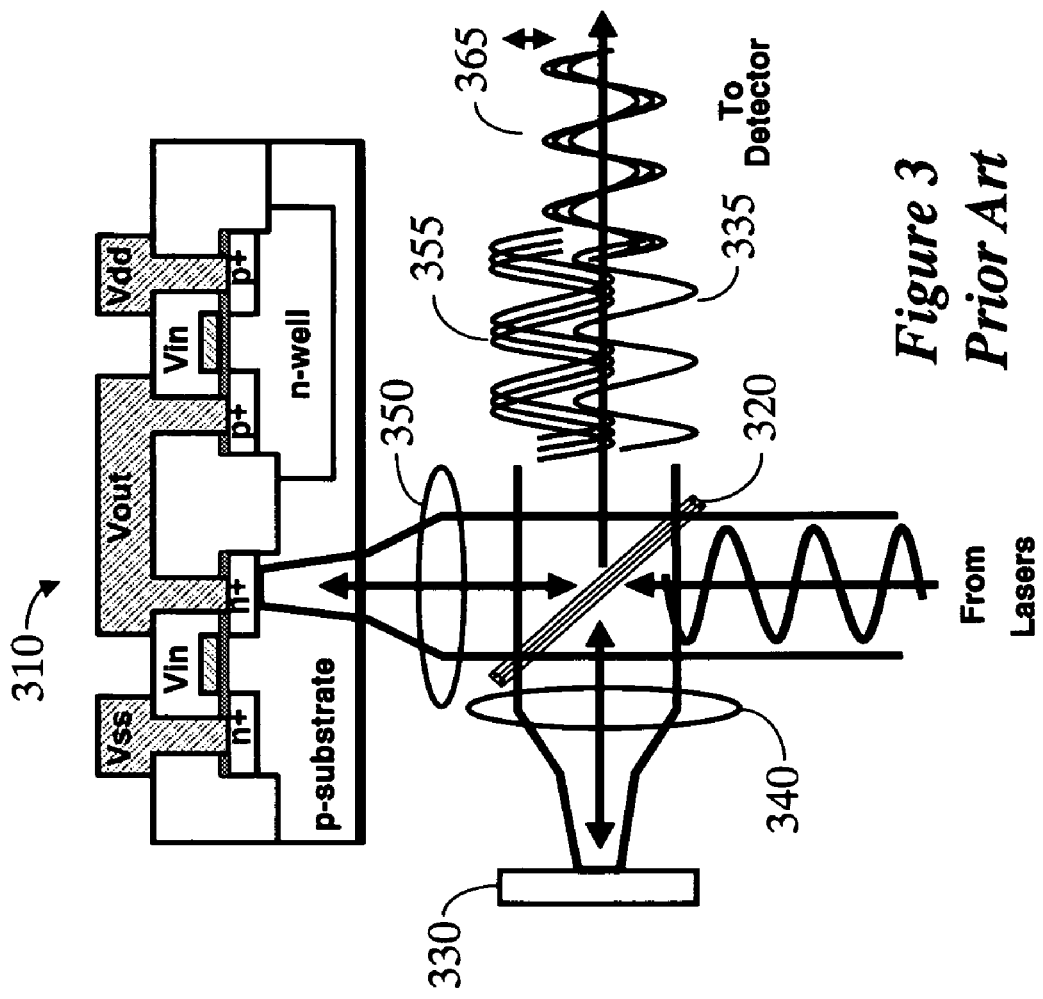
FIG. 3 is a diagram illustrating phase detection scheme with Michelson Interferometer arrangement according to the prior art.
Figure 2:
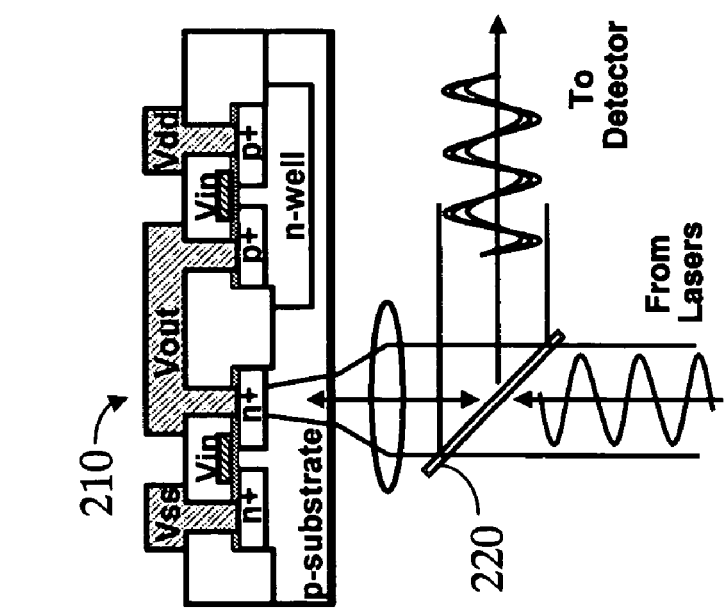
FIG. 2 is a diagram illustrating standard amplitude detection mode used in the prior art.
Figure 5:
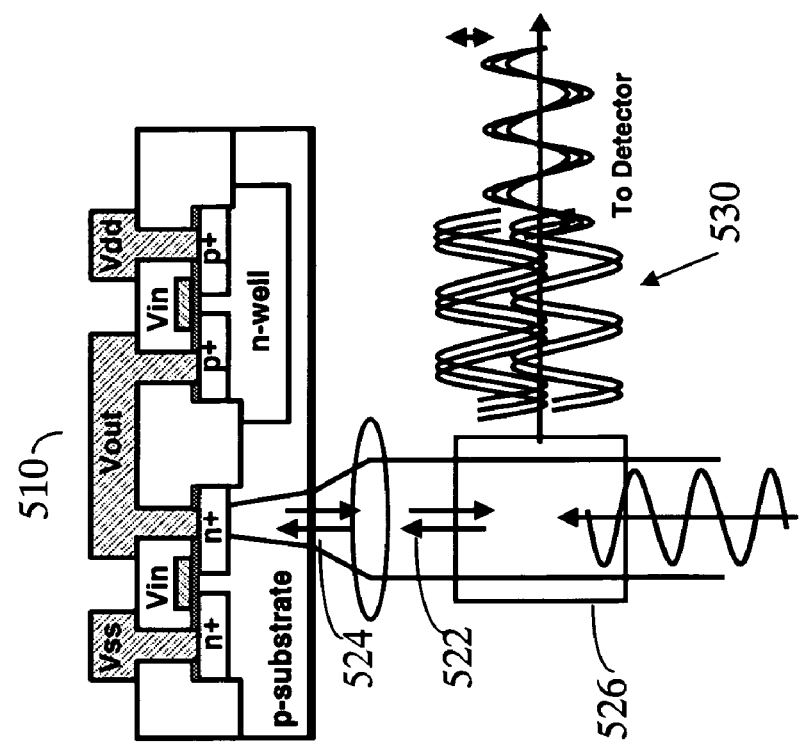
FIG. 5 is a diagram illustrating time differential probing (TDP) scheme for phase detection according to the prior art.
Figure 4:
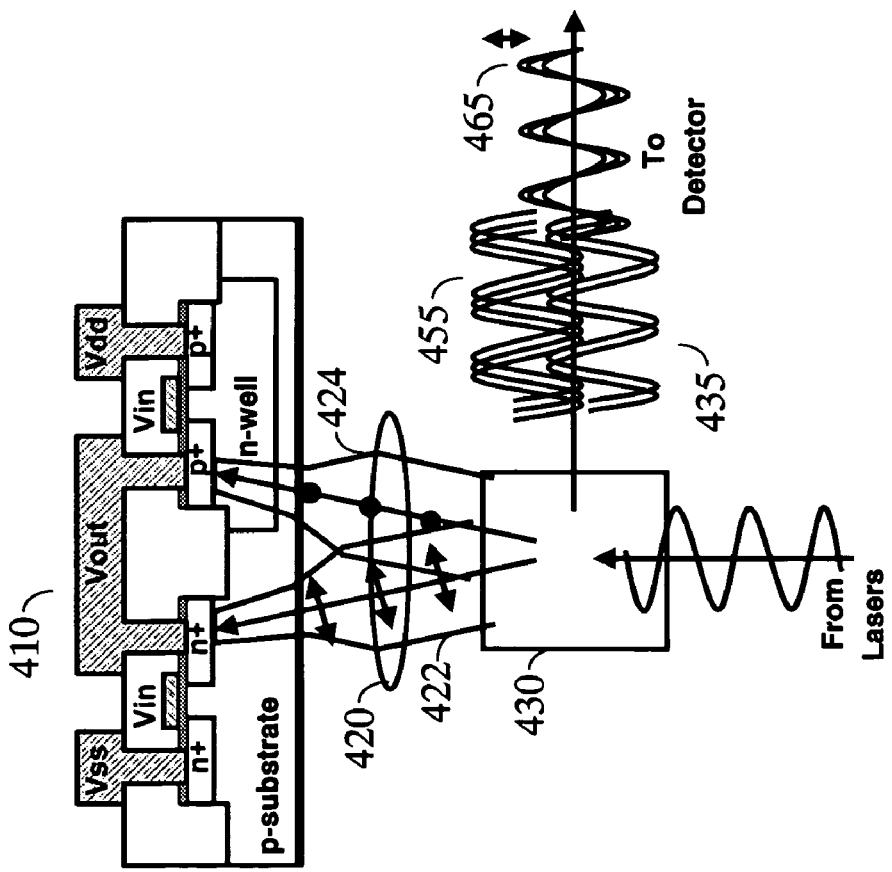
FIG. 4 is a diagram illustrating a spatial differential probing arrangement for phase detection according to the prior art.

The invention is described herein with reference to particular embodiments thereof, which are exemplified in the drawings. It should be understood, however, that the various embodiments depicted in the drawings are only exemplary and may not limit the invention as defined in the appended claims.

DETAILED DESCRIPIION

Various embodiments of the present invention provide apparatus and method for high bandwidth electrical signals using modulated laser in an optical probing system. These embodiments simplify the prior art system by eliminating the need for a mode-locked laser source. Consequently, the complexity and cost of the system is reduced, while its operation is simplified and adaptable to various testing environments. On the other hand, the embodiments enable probing of modern circuit devices operating at high frequencies.

An embodiment of the invention will now be described in details with reference to FIG. 6. Most notably, in this embodiment of the invention, a tunable or continuous wave (CW) laser source LS 604 is used, rather than the pulsed mode-locked laser source of the prior art. Using a CW laser source, such as a conventional tunable laser diode, reduces the overall cost and complexity of the system. Of course, as noted above, for laser probing of today's integrated circuits a high temporal resolution is needed, which led to the use of mode-locked lasers. In this embodiment, however, the CW laser is used in conjunction with a modulator 605 to provide a modulated laser beam to the beam optics 625. The intensity, I, of the laser beam is modulated at a frequency $f_f$, as schematically shown in callout 606.

The modulated beam is then shaped and focused onto a selected place on the DUT 660 by beam optics 625. The DUT operates at a designed clock speed and is provided with test vectors 642, generated by the ATE 640. The operating voltage in the DUT is represented by a frequency $f_v$, as illustrated by callout 643. The response of the devices in the DUT to the test vectors 642 causes changes or perturbations in the laser beam as it reflects from the DUT. This reflection is collected by the optics 625 and sent to the photosensor 636. The output signal of the photosensor is acquired by the signal acquisition board 650 and is provided to the computer 670 for analysis.

As can be understood by those skilled in the art, the operational frequency, $f_v$, of the DUT may be higher than the bandwidth of photosensor 636. This is why a simple CW laser source cannot be used to probe the DUT operating at high frequencies. Therefore, according to this embodiment of the invention, the CW laser source is modulated. In this way, a DUT operating at a frequency higher than the bandwidth of the photosensor 636 can be probed. That is, the laser source is modulated so as to provide, say a sine-shaped beam intensity at a given frequency. When the beam bounces off of the DUT, it is perturbed according to the DUT's response to the test vectors. This causes a frequency modulation, $\Delta f$, in the sine wave shape of the laser beam. The frequency modulation, $\Delta f$, is in a much lower frequency than the operating frequency of the DUT and is within the bandwidth of, and can be detected by the, the photosensor. This can be analogized to FM radio transmission, wherein the signal is composed of a carrier wave modulated by an amount corresponding to the information of interest, i.e., the radio program. The radio receiver is engineered to decipher the modulation amount so as to extract the information of interest from the carrier wave. In the embodiment described herein, the carrier wave is the laser beam modulated at a carrier frequency, $f_f$, and the information of interest is the modulation, $\Delta f$, caused by the response of the DUT to the ATE test vectors. The photosensor detects the signal and the computer 670 extracts the information by extracting the modulation, $\Delta f$, from the carrier wave, $f_f$.

In mathematical terms, the signal, S, is a product of the DUT voltage, $V_f$, and the laser beam's intensity $I_f$. The DUT voltage is a sum of the clock frequency and the test vector, i.e., $V_f = \cos[(f_0 + \Delta f)t]$; while the laser beam's intensity is given by $I_f = \cos[f_0 t]$. The product then results in:

$$S = V_f * I_f = \cos[(2f_0 + \Delta f)t] + \cos[\Delta f_0 t] \quad \text{Eqn 1.}$$

As can be understood, the first term of Eqn 1 may be outside the bandwidth of the photosensor; however, the second term is of much lower frequency and can be sensed by the photosensor. In this manner, the embodiment of the present invention enables the use of an inexpensive and simplified CW laser source, while facilitating probing of DUT's operating at a frequency beyond the bandwidth of the photosensor.

Figure 6:
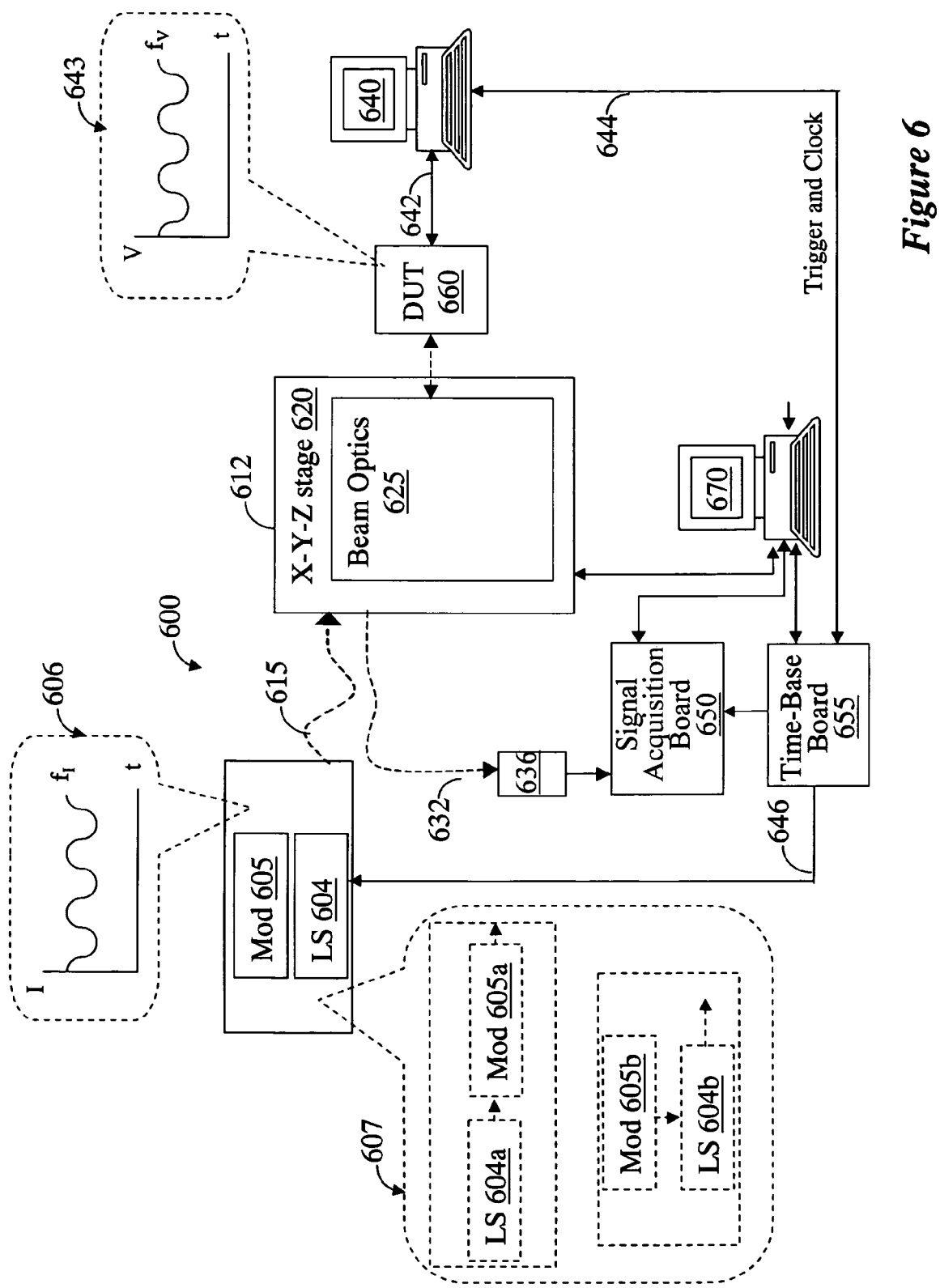
FIG. 6 depicts an embodiment of the present invention using a laser source and a modulator.

As shown in the callout 607 of FIG. 6, the modulation of the laser source LS 604 can be performed in various methods. According to one example, CW laser source 604a is operated to emit a CW laser beam. The CW laser beam is made to traverse an optical modulator, 605b, such as a modulated LCD, Mach-Zehnder optical intensity modulator, Acousto-Optical modulator etc. Consequently, when the laser beam exits the optical modulator it is modulated at a frequency dictated by the optical modulator. According to a second example, a laser source 604b is driven by a modulator 605b to output a modulated laser beam having a frequency dictated by the modulator 605b. For example, it is well known in the optical communication arts to use such a modulator to drive a tunable laser diode for communication systems operating at speeds of 10-40 Gbps.

As is also shown in FIG. 6, the ATE provides a clock and sync signal 644 to the probing system. This signal can be used to modulate the laser at the same frequency as the DUT, using signal 646. Further, the modulation can be in or out of phase with the DUT signal.

Figure 7:
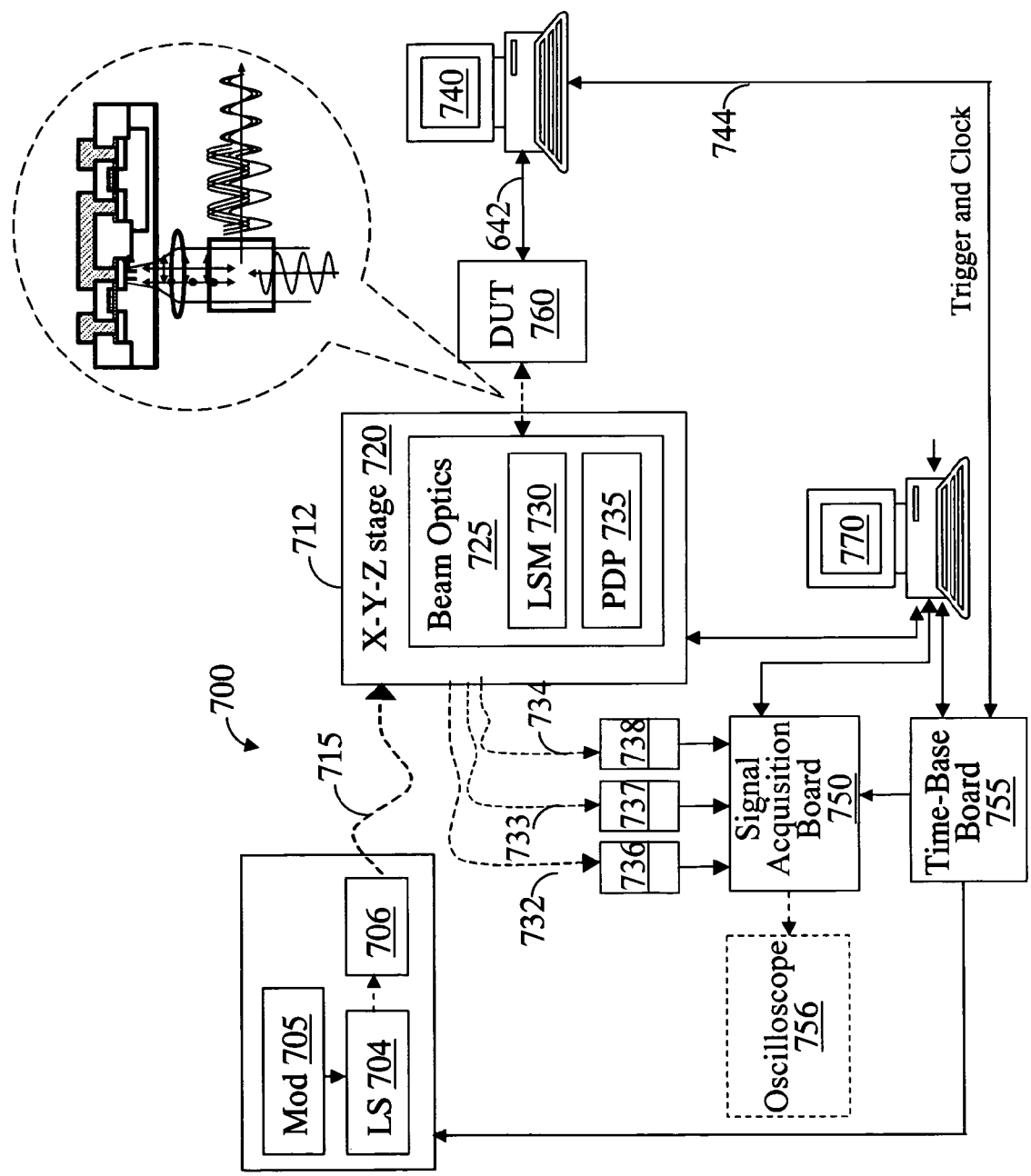
FIG. 7 depicts another embodiment of the present invention using modulated laser source.

FIG. 7 depicts another embodiment of the present invention, using modulated laser source. Laser source 704 is a tunable laser source and is controlled by modulator 705 to provides a modulated laser beam. Laser source 704 may be, for example, a diode-pumped solid-state (DPSS) laser, a semiconductor laser diode, etc. The wavelength can be an 'invasive' wavelength such as 1064 nm, or it may be a non-invasive wavelength (>1100 nm). By 'invasive' it is meant that the laser illumination interacts, i.e., generates electron-hole pair, with or causes significant changes in the response of the DUT; while the non-invasive beam is modulated mainly by free carriers. In some embodiments the laser source can also consist of multiple lasers with different wavelengths. For example, an invasive wavelength can be used in conjunction with a non-invasive, or less invasive wavelength.

In this particular embodiment, the laser beam is polarized in polarizer 706 and transferred to the beam optics 725 via fiber optics 715. Of course, free-space coupling can be used instead; however, if fiber optics coupling is used, it is expected to be polarization-maintaining fiber optics. In this particular embodiment, the output of the laser source arrangement is monitored by diverting part of the light using light path 733 and inputting the diverted light to photosensor 737. The output of the photosensor 737 is analyzed by computer 770 to ensure proper output of laser beam.

Beam optics 725 needs to deliver the laser beam to selected points within the DUT. While any optical system for pointing a beam can be used, in this embodiment this is achieved by utilizing a Laser Scanning Microscope (LSM 730). An objective lens (not shown) is typically used to generate a focused spot in the DUT. The objective can be a normal air-gap objective, a liquid immersion objective, or a solid-immersion lens (SIL) objective.

In this embodiment beam optics 725 also includes a common-path polarization differential optics PDP 735. While other arrangement can be used, the common-path PDP 735 is expected to provide performance improvement and better ease-of-use compared to alternatives. The common-path PDP optics is described in more details below and its principle is illustrated in the broken-line callout in FIG. 7. Optics 725 is coupled to X,Y,Z stage 720 for navigation. Since movement of the optics relative to the DUT is the goal, the stage 720 can be arranged to move the optics (as shown) or it can be arranged to move the DUT. The stage 720 can be manually controlled, or electrically controlled using computer 770.

Light reflected from the DUT is collected and applied to fiber optics 732, 734. As before, fiber coupling is optional and free-space coupling can also be used. If fibers are used, they can be single mode fiber, multimode fiber variety, for maximum coupling efficiency, or they may be fiber amplifier type, to provide optical gain so as to reduce electronic noise. Other optical amplifiers may also be used. The fiber optics 732, 734, deliver the reflected light to photosensors 736, 738. The photosensors can be any conventional light detectors, such as PIN diode, avalanche photo diode (APD), etc. For example, an InGaAs APD with 6 GHz bandwidth, conventionally used by the telecom industry, can be used. APD's have internal gain and can be used so as to reduce the overall system electronic noise. The internal gain of APD's can be changed by varying the applied reverse bias voltage. The output signal of the photosensors 736, 738 is collected by signal acquisition board 750, and the output of the board 740 is applied to computer 770. Optionally, the signal from photosensors 736, 738 can be applied to an oscilloscope 756, or to both the computer 770 and oscilloscope 756.

Various embodiments of the signal acquisition board 750 will be described below. On the other hand, the oscilloscope 756 may be a conventional off-the-shelf instrument, or may be replaced with other conventional testers such as, e.g., spectrum analyzer, edge discriminator (for jitter investigations), a lock-in amplifier, etc. For an improved ease-of-use, the oscilloscope 756 may be controlled by computer 770. Specifically, computer 770 can be programmed to enable better control by providing a simpler and programmable user interface. For optimal system performance the oscilloscope 756 should be chosen to have certain capabilities, such as high memory capacity and high memory access speed. In this embodiment, the oscilloscope's memory is segmented to provide enhanced capability.

The system of FIG. 7 can be operated in two general modes: navigation mode and data acquisition or probing mode. During navigation, the laser source LS704 is operated in a CW mode without any modulation. The LSM is then used to scan a designated area of the DUT using the CW laser beam and provide an image of that area. This image can be used for navigation, i.e., to place the laser beam at a particularly desired location or device during probing mode. As will be shown further below, using an LSM is but one method for imaging an area for the navigation function, but other methods can be used to obtain an image of a selected area. For example, an arrangement, such as a CCD camera, can be used to obtain an image of a designated area of the DUT. Once an image is acquired and a location or device to be tested/probed is selected, the laser beam is pointed to that location using, in this embodiment, the LSM. That is, in the probing mode the LSM is not used to scan an area, but rather to "park" the laser beam at a designated location.

During data acquisition operation, the laser source LS704 is operated in a modulated mode and the modulated laser beam is pointed to a particular point on the DUT, while the DUT is stimulated using various stimulus signals 742. When the test signal is applied to the illuminated device, the laser light reflected from that device is further modulated by the reaction of the device to the stimulating signal. The reflected laser light is then collected and analyzed by the system. When the output signal obtained by the system is faint, the stimulus signal 742 should be designed to drive the DUT in a repetitive manner so as to obtain several measurements for each desired location/device, and the resulting measurements may be averaged. The signals 742 may be as simple as power and ground plus a test signal delivered via conventional probes (not shown). Of course, for more complex ICs and more elaborate testing, an ATE tester 740 can be used to deliver complex and programmable signals 742, or the DUT can be running test signals internally and independently. Regardless of the stimulus applied, a trigger signal 744 may also be provided to synchronize the modulator 705, the computer 770, and/or the oscilloscope 756, depending on the information sought. For example, if the DUT is being tested for temporal response to the stimulating signal, then a synchronizing signal should be provided to the oscilloscope. However, for other investigations, e.g., when a spectrum analyzer is used, no synchronization signal is needed.

The optical bench 712 may include a conventional vibration isolation system (not shown) to isolate the DUT 760 and the beam optics 725 from ambient or vibrations noise or mechanical noise generated by the DUT stimulus. The use of vibration isolation system may be avoided by proper optical system design. The goal is to minimize unwanted movement of the DUT 760 relative to the beam optics 725 during imaging and signal acquisition. Relative movement can cause return laser intensity variations (due to defocusing effects, for example) that degrade the signal to noise ratio (SNR) of the measurement and degrade image quality.

As can be understood, the inventive system is advantageous over the prior art system in that it uses mostly inexpensive and conventionally available components in an arrangement that produces superior results to prior systems using specifically designed components. For example, the described embodiment uses a conventional tunable laser source, rather than the complex mode-locked laser source. Similarly, a commercially available oscilloscope can be used, rather than complex and custom high-speed timing electronics. The photosensors can be InGaAs APD's which are conventionally used by the telecom industry, while the DUT testing can be done at frequencies beyond the bandwidth of the photosensors. Additionally, the common-path PDP optics provides ease-of-use benefits over previous schemes, especially since both the reference and probing beams are aimed at the same location. The common-path PDP optics also reduces the sensitivity of the system to vibrations, as both the reference and probing beams traverse the identical path.

Figure 8:
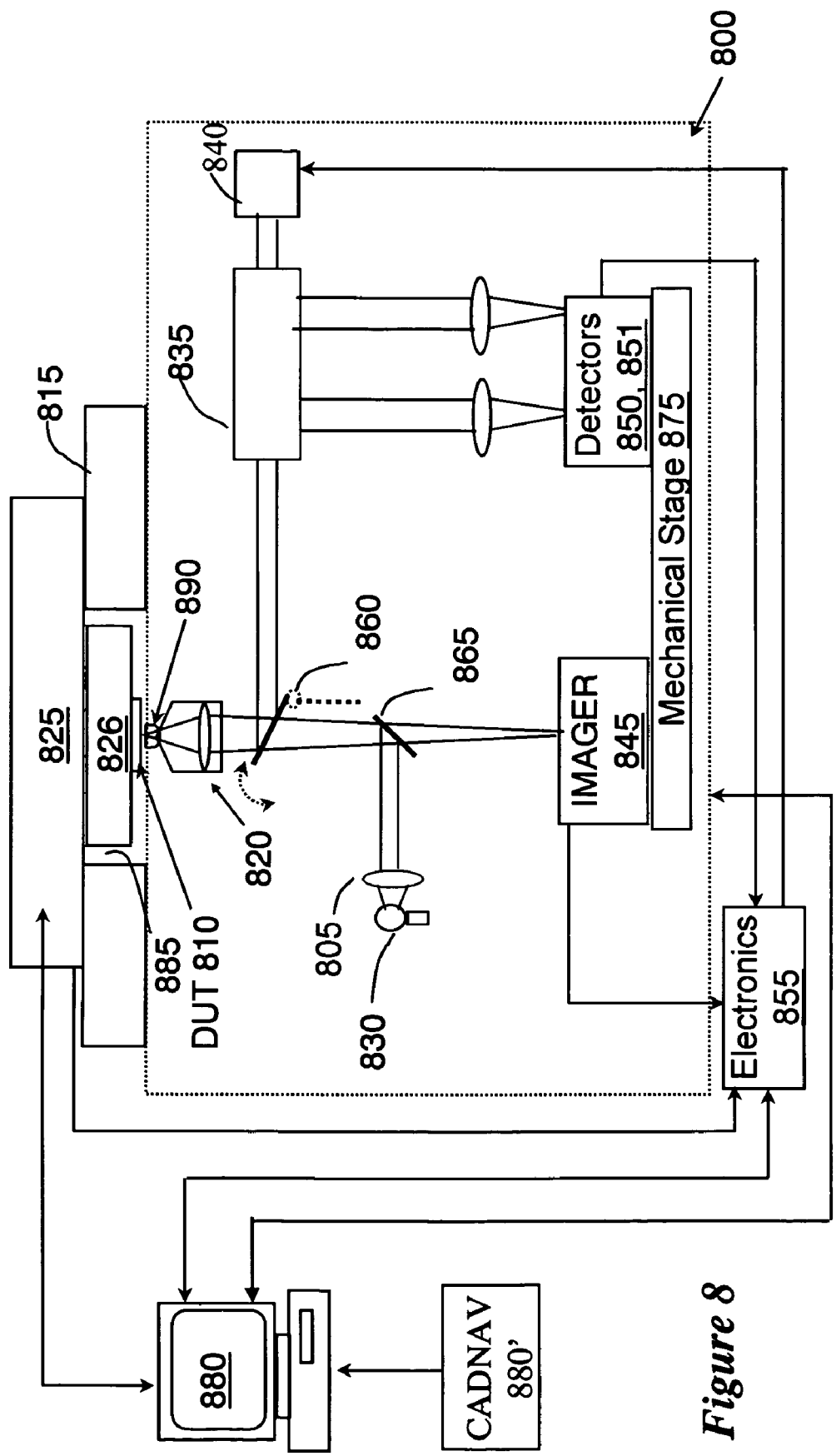
FIG. 8 depicts another embodiment of the present invention using two optical paths.

Prior to explaining the PDP optics and its operation in details, another embodiment of the testing system is provided, by way of illustrating that either or both the modulated laser feature and the PDP optics may be used in various optical systems. FIG. 8 illustrates an embodiment wherein the modulated laser source and the PDP optics are used in a system wherein two optical paths are provided, one for navigation and one for probing. System 700 includes a vibration isolation tabletop 815 that supports a DUT adapter 825, providing electrical connections to the DUT load board 826 onto which DUT 810 is loaded. System 800 also includes a mechanical stage 875, upon which the optical elements are assembled. In this embodiment, the optical elements are arranged so as to provide a navigation optical path and a probing optical path. To establish the navigation optical path, mirror 860 is placed in the downward pointing position, as illustrated by the broken line. With the mirror 860 in this position, the light source 830 is turned on and its light is collected by lens 805 and directed toward beam optics 820 via partially reflecting beamsplitter 865. Additionally, in this arrangement an optional solid immersion lens (SIL) 890 is added to the beam optics 820. SIL 890 may be any conventional solid immersion lens. The light flood illuminates the DUT 810 in a coaxial manner. The light returned from the DUT 810 is recollected by SIL 890 and beam optics 820 and then imaged onto imager 845, after being transmitted by partially reflecting beamsplitter 865. The imager's output signal is collected by electronics 855 and sent to computer 880, so as to provide an image of the illuminated area of the DUT. The imager 845 can be any conventional two-dimensional detector capable of imaging the DUT 810, such as, for example, vidicon camera, or a focal plane array.

The image obtained can be used for navigation and correct placement of the laser beam for probing. That is, depending on the particular test to be run, one may wish to select any particular section or device on the DUT for laser probing. Using information about the chip design and layout stored in CAD software 780', such as, for example, Cadence™, and using navigation software 780', such as, for example, Merlin's Framework™ available from Knights Technology (www.electroglass.com), one may select a particular device for any particular test and use computer 780 to place the beam at the correct location for the test.

To switch to laser probing mode, mirror 860 is flipped into the position illustrated in solid lines. In this position light source 830 is turned off and the laser source 840 is turned on. Laser source 840 is any of the examples of modulated laser source described above, e.g., a tunable laser source driven by a modulator. Light from the laser source 840 passes through the common patch PDP optics, 835, as described herein, and is reflected by mirror 860, so as to enter beam optics 820 and SIL 890. The laser beam is reflected by the DUT and the reflection is collected by SIL 890, the beam optics 820, deflected by mirror 860, deflected by the common path PDP optics 835, and detected by detectors 850, 851. As explained before, the reflected light is further modulated by the DUT according to its response to the test signals. The output of the detectors 850, 851 are collected by the electronics 855 and sent to computer 880. For that purpose, electronics 855 includes the necessary elements as described herein, such as, e.g., differential amplifiers, balanced receiver, gated integrators, sample-and-hold electronics, analog-to-digital converters, variable gain and offset electronics, etc. The utilization of these elements will depend on the application. Additionally, as with the other embodiments described herein, if temporal resolution is needed, a synchronization signal may also be provided from the test signal generating equipment.

Figure 9:
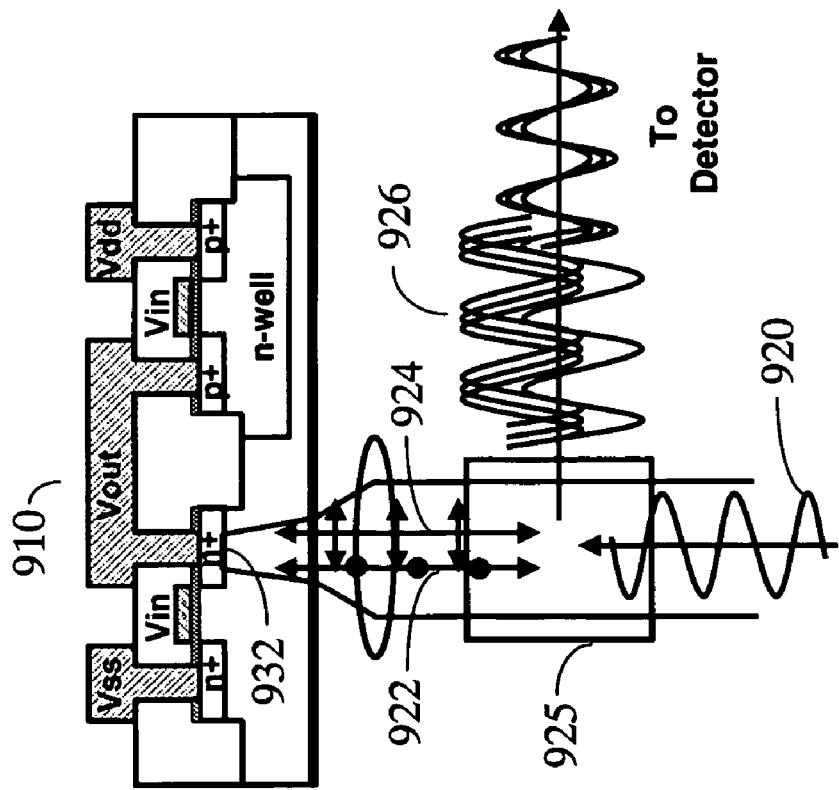
FIG. 9 is a diagram illustrating the polarization differential probing (PDP) mode for phase detection according to an embodiment of the invention.

FIG. 9 is a diagram illustrating the polarization differential probing (PDP) mode for phase detection according to an embodiment of the invention. A laser beam 920 from a single modulated laser source is split into two orthogonally polarizes laser beams 922, 924, by beam optics 925. Both beams 922, 924 traverse the same optical path, but have orthogonal linear polarization states. Unlike the polarization scheme of the prior art where two different locations on the DUT are illuminated by the reference and the probing beams, in this embodiment both beams are made to incident on the same point 932 on the DUT 910. Also, unlike the polarization scheme of the prior art where the two beams are split in time, in this embodiment both beams are made to be incident on the DUT 910 at nominally the same time. For optimal effect, the polarization directions of the beams 922, 924 are aligned with the transistor gate width and length directions in the DUT 910. This polarization difference results in phase modulation differences between the two beams after DUT interaction, as will be demonstrated below with reference to FIG. 10. The two beams 922, 924 are made to interfere 926 after their DUT interactions in order to convert their phase variations into amplitude variations that can be detected using photosensors. A differential detection scheme is can be optionally employed to increase signal modulation.

Figure 10:
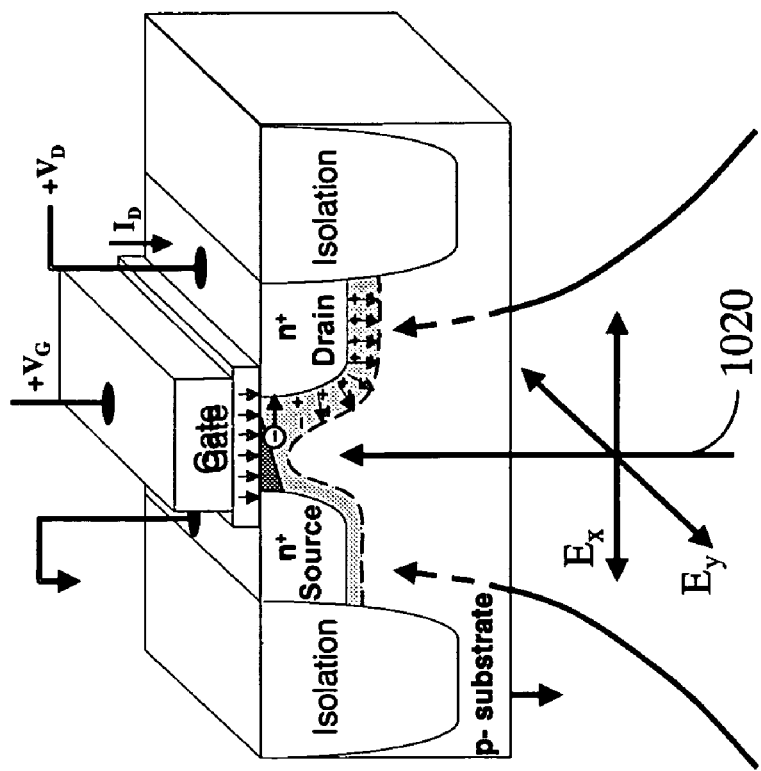
FIG. 10 is a diagram illustrating why the laser probing signal modulation is intrinsically polarization sensitive for CMOS transistors due to the intrinsic asymmetry of the CMOS device.

FIG. 10 is a diagram illustrating why the laser probing signal modulation is intrinsically polarization sensitive for CMOS transistors due to the intrinsic asymmetry of the CMOS device. A laser beam 1020 is incident from the bottom (through the silicon substrate). For maximum Franz-Keldysh effect (electro-absorption/refraction), the laser beam's polarization state should be aligned parallel to the direction of the strong modulating fields in the gate/drain regions of the transistor, i.e., along the gate length direction (along $E_x$ in FIG. 10). On the other hand, the Plasma-Optical effect requires the laser beam to drive the charge carriers induced under the gate. Since the charge carriers are less constrained in the gate width direction, a laser beam polarized along $E_y$ should be most sensitive to this effect. In practice, the laser beam is found to be most strongly modulated when its polarization vector is aligned along $E_y$. Using these effects, the present inventors realized that, unlike the prior art interferometric arrangements, the reference beam need not traverse a reference path separate from the probing path. Rather, it is possible to have both reference and probing beams traverse the same path and be pointed onto the same point on the DUT at nominally the same time, while still obtaining an interferometric effect that correlates to the DUT's response to the stimulating signal. Of course, it should be appreciated by artisans that the use here of "reference beam" and "probing beam" is for convenience purposes only, since it should be apparent that unlike the prior art, here both beams illuminate the exact same area to be investigated at nominally the same time and, therefore, in this sense, each beam can be both a reference and a probing beam.

Figure 11:
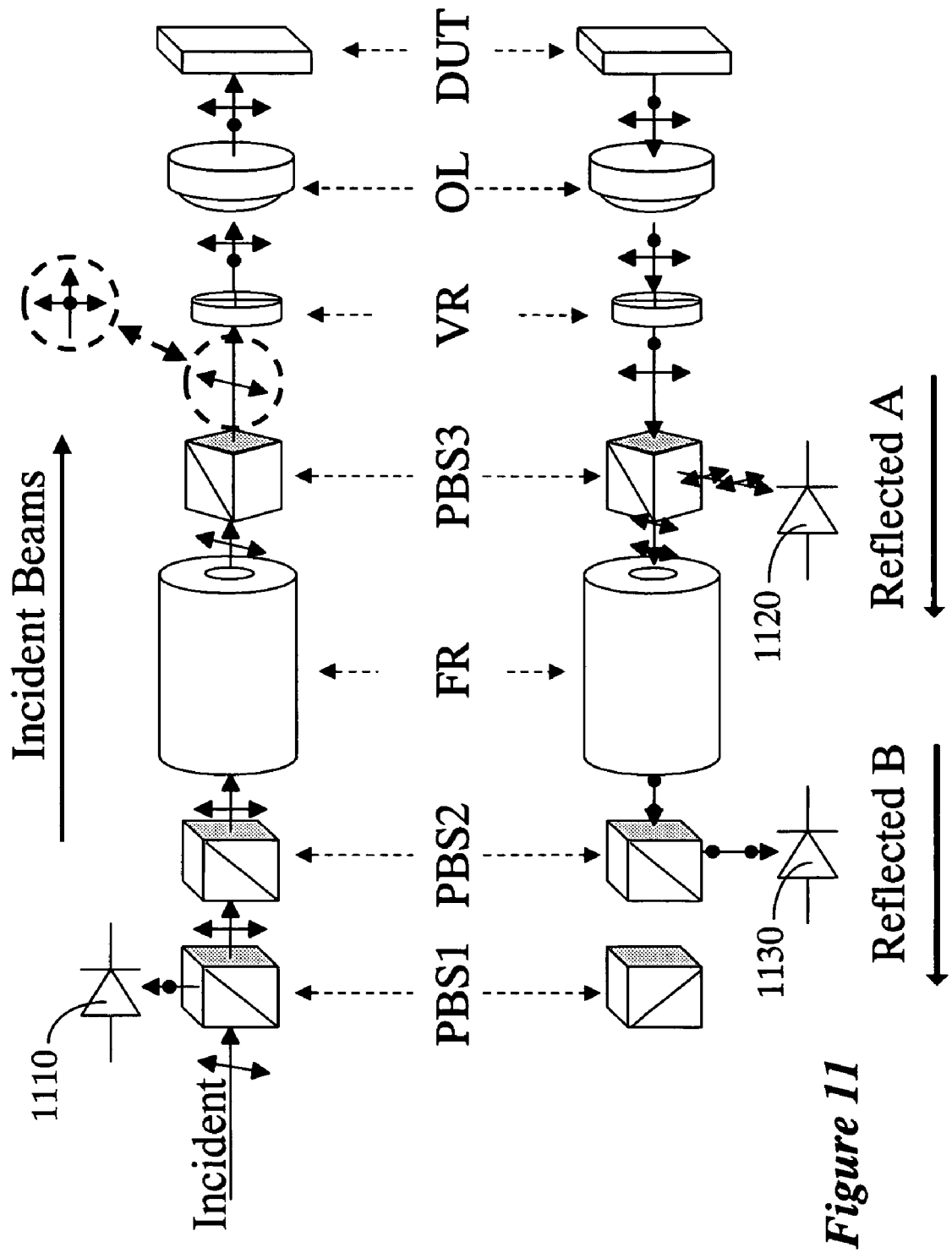
FIG. 11 is an illustration depicting a PDP optical path according to an embodiment of the invention.

FIG. 11 is an illustration depicting a common-path PDP optical arrangement according to an embodiment of the invention. While in actuality the incident beam and the reflected beam traverse the same elements, for better understanding the illustration is divided into two optical paths, showing each optical element twice. The top path is the incident beam path originating from the laser source, while the bottom path is the reflected beam path. The incident beam travels from left to right in the illustration. Along the beam path, vertically oriented arrows indicate a vertically polarized beam while dots indicate a horizontally polarized beam. A tilted arrow indicates a beam that is linearly polarized at some angle off the vertical. Spatial separation between a dot and an arrow depicts a phase difference between the two beams.

The beam from the modulated laser source enters the first polarizing beam splitter PBS1 so that part of the beam is deflected towards light sensor 1110. This deflection may be set at 5% or so. The output of the sensor 1110 is used to monitor the beam's intensity and is not part of the PDP optics, but rather an optional intensity monitor. The remaining part of the beam that passes through the first PBS cube (PBS1) enters the second polarizing beam splitters PBS2, which is oriented to pass only a vertically oriented beam. The beam's polarization state is rotated a predetermined amount so as to generate a rotated polarized beam that is an equivalent of a superposition of a vertically polarized beam and a horizontally polarized beam. In this example, the beam is rotated 45 degrees from the vertical by the action of the Faraday rotator (FR) and the third PBS cube (PBS3) is oriented to transmit the rotated beam. Consequently, at this stage the beam is the equivalent of a superposition of a vertically polarized beam and a horizontally polarized beam, both beams equal in amplitude and in phase with each other. If the amplitude of the beam should not be set to equal, the rotation should be to a different angle. The dashed callout circles in the incident beam path, between PBS3 and VR, indicate the equivalence between a 45-degree polarized beam and two in-phase, equal amplitude beams, one polarized vertically and the other horizontally. As can be understood, for certain application the rotation may be to other than 45 degrees, in which case the equivalence would be of two, in-phase beams, one polarized vertically and the other horizontally, but having different amplitude.

The two beams then enter the variable retarder VR. The fast and slow axes of the variable-retarder (VR) are aligned along these vertical and horizontal polarization directions. Thus, after passage through the VR, the beam consists of two spatially coincident, equal-amplitude, orthogonally polarized beams that are phase-shifted (retarded) with respect to each other by a small amount (nominally, $\pi/4$). This is indicated in the illustration by the dot being slightly behind the vertical arrow, representing a retardation of the horizontally polarized beam relative to the vertically polarized beam. The two beams are then focused onto the same point on the DUT by the objective lens OL. The DUT is oriented such that the polarization directions of these two beams are aligned with the length and width directions of the transistor gates. Interaction with the DUT phase modulates one of the beams relative to the other by a small amount. In this manner, the beam being modulated by the DUT may be thought of as the probing beam, while the other beam may be thought of as the reference beam. Of course, unlike prior art interferometers, here none of the beams traverses a reference optical path, but rather both beams traverse the identical path to the probing location. Therefore, as noted before, in this sense there is no reference beam and probing beam, but for convenience one may refer to one beam as the reference beam and the other as the probing beam.

After the beams are reflected by the DUT (FIG. 11, bottom) the two linearly polarized beams retrace their path to the VR. The phase modulation induced on the beams by the DUT is typically much smaller than the phase shift induced by passage through VR and so is not explicitly shown here. Passing through the VR introduces an addition phase-shift between the two returned reference and probing beams (now nominally phase-shifted by $\pi/2$). At PBS3, a portion of each beam is reflected and sent to photosensor 1120, and the other portion is transmitted. The reflected portions interfere, since they are now in the same polarization state, and generate the reflected-A signal. In one embodiment, only one photosensor 1120 is used and its output is collected by the receiver electronics and analyzed, as described in more detail below. According to another embodiment, the transmitted portions are deflected out of the beam path via the action of FR and PBS2 so as to be detected by a second photosensor 1130. The transmitted halves also interfere since they are also in the same polarization state, generating the reflected-B signal. The reflected-B signal is collected by the receiver electronics and is analyzed, as described in more details below.

An analysis of the interference condition shows that the intensity of the reflected-A signal is given by:

$$R(A) \propto (E_x/\sqrt{2})^2 + (E_y/\sqrt{2})^2 - 2[(E_x/\sqrt{2})(E_y/\sqrt{2})]\cos(\theta+\delta) \qquad \text{Eqn 1.}$$

Here the $\theta$ term accounts for the static phase shift introduced by the double-pass through the variable rotator, VR, while the $\delta$ term is the small varying relative phase shift of the two beams resulting from the interaction with the DUT as it undergoes testing. Similar analysis for the reflected-B signal results in:

$$R(B) \propto (E_x/\sqrt{2})^2 + (E_y/\sqrt{2})^2 + 2[(E_x/\sqrt{2})(E_y/\sqrt{2})]\cos(\theta+\delta) \qquad \text{Eqn. 2.}$$

Figure 12:
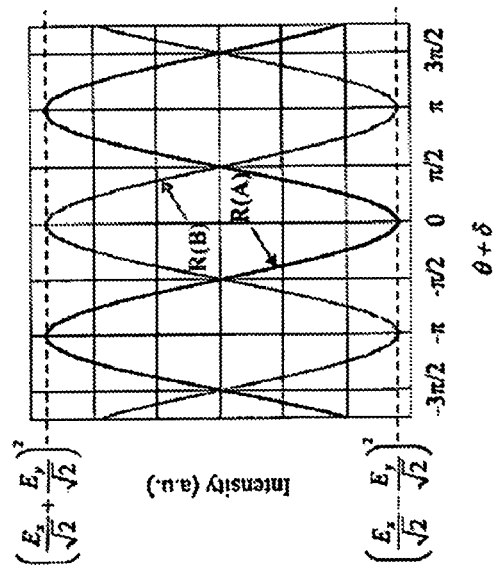
FIG. 12 is a plot illustrating the benefit of detecting both return beams of the PDP interferometer.

Eqn. 1 and Eqn. 2 are plotted in FIG. 12. From this plot, it is clear that setting the static phase shift, $\theta$, to $\pm\pi/2$ (quarter waver condition for the round trip beam) gives maximum sensitivity to changes in $\delta$ and makes the two signals nominally equal in intensity. Under this condition, Eqn. 1 and Eqn. 2 simplify, respectively, to:

$$R(A) \propto (1/2)E_x^2 + (1/2)E_y^2 + E_x E_y \sin(\delta) \qquad \text{Eqn. 3.}$$

and $$R(A) \propto (1/2)E_x^2 + (1/2)E_y^2 - E_x E_y \sin(\delta) \qquad \text{Eqn. 4.}$$

Then, $$R(A) - R(B) \propto 2E_x E_y \sin(\delta) \qquad \text{Eqn. 5.}$$

Thus, in principle, subtracting the two reflected signals eliminates their large DC component along with any noise it carries, such as from laser power variations, while doubling the signal modulation. Consequently an improved signal to noise ratio (SNR) is provided when using this differential signal detection mode. In practice, digitally dividing one signal by the other instead of subtracting them is performed because it is more tolerant of unbalanced reflected signals.

As can be understood, since both reference and probing beams traverse the identical optical path and are pointed to the same location on the DUT at nominally the same time, it means that this scheme has better phase noise immunity then prior art interferometric systems. Notably, both beams are subject to the same vibrations and optical losses. This eliminates or reduces the need for active vibration compensation, path length matching, and power matching of the two arms of the interferometer. Additionally, there is no need to find a second location for the reference beam for each location tested. Rather, both beams are always pointed at the location to be tested. Accordingly, there is also no need to introduce separate spatial control of the reference and probing beams. There is also no need for complicated beam time-shifting and unshifting optics and no coupling of signal strength with time resolution. Consequently, the inventive common-path PDP arrangement can be used in multiple applications where phase detection is needed and provides drastic reductions in vibration noise, reduces the system complexity, and simplifies the setup of the system.

Figure 13C:
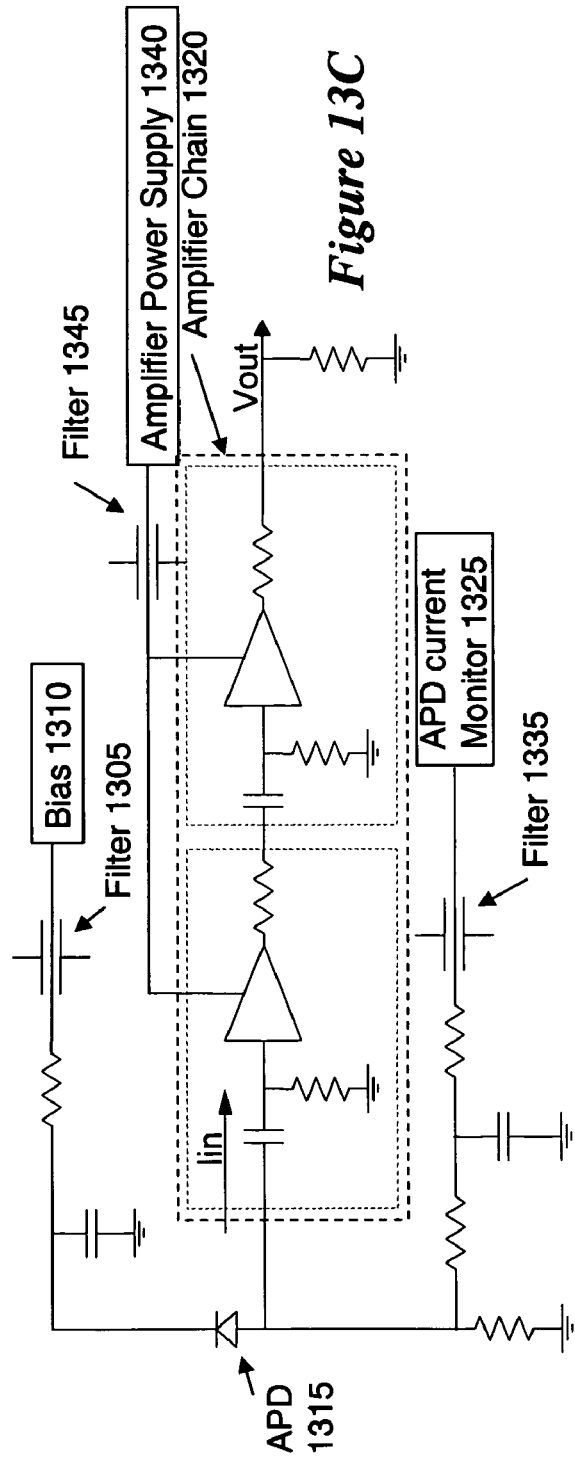
FIGS. 13A-13C are diagrams of the receiver electronics according to embodiments of the invention.
Figure 13A:
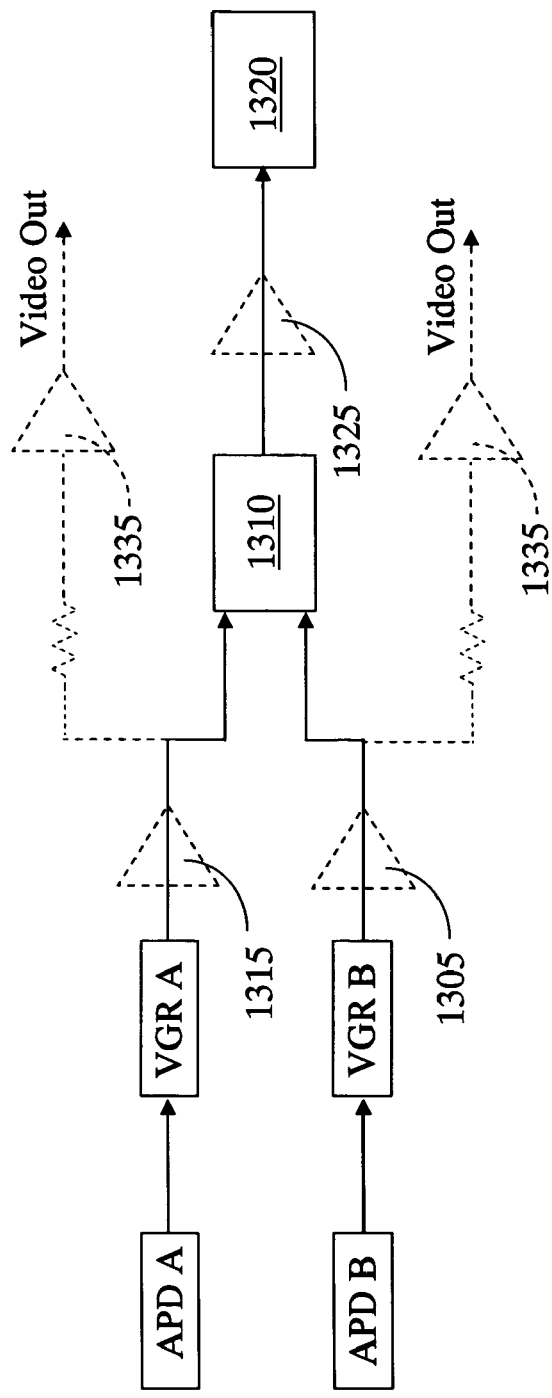

FIG. 13A is a block diagram of the receiver electronics according to an embodiment of the invention. The output of the two photosensors, e.g., APD A and APD B, are applied to two variable gain receivers, VGR A and VGR B. The output of the variable gain receivers may optionally be amplified by amplifiers 1305 and 1315, and then applied to the balanced receiver 1310. The output of the balanced receiver may also be amplified by amplifier 1325, and then applied to the measurement equipment 1320, such as an oscilloscope, spectrum analyzer, edge discriminator, etc. For navigation and imaging, the signal from one or both APD's may be DC coupled to a video amplifier 1335. In FIG. 13A two video amplifiers are shown in broken lines, as the arrangement can be optionally constructed with a single video amplifier coupled to only one APD, two amplifiers, each coupled to one APD, or a subtracting arrangement wherein the signals from the APD's are subtracted from each other to provide a difference video image.

Figure 13B:
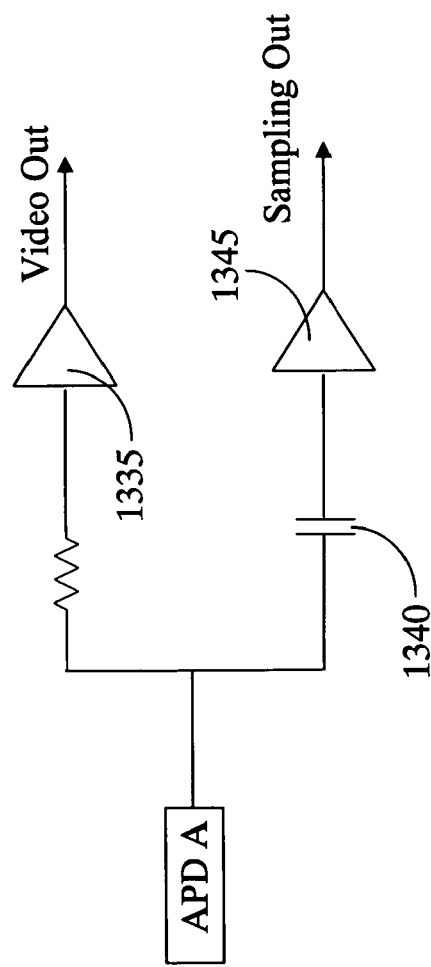

On the other hand, FIG. 13B illustrates a receiver electronics according to an embodiment of the invention when only one photosensor APD A is used. In this example, when the system is in the navigation mode, the signal from APD A is DC coupled to video amplifier 1335, and a video out signal is output from the video amplifier 1335. When the system is in probing mode, the signal from APD A is sent through high pass filter 1340 to high-bandwidth, high-gain signal amplifier 1345 to provide a signal that is applied to a high speed digitizer, a digital oscilloscope, a spectrum analyzer, etc. The filter 1340 can be set to filter signals below, e.g., 1 KHz to reduce or eliminate any signal noise caused by DUT vibration and other noise. The sampling out signal may be sent to an oscilloscope.

FIG. 13C depicts an embodiment of receiver electronics for a single photodetector, non-differential detection mode. This receiver electronics can be used when the change in the probing beam is sufficiently high so that only one photodetector, e.g., photodetector 1220 in FIG. 12, is needed for the probing operation. As shown in FIG. 13C, a bias 1310 is applied to APD 1315 via filter 1305. The current flowing through the APD 1315 is monitored using current monitor 1325, which is connected to the APD via filter 1335. Filter 1335 is mainly provided in order to reduce signal interference. To obtain an output signal, the APD 1315 is connected to amplifier chain 1320 (illustrated as line in, i.e., Iin—standing for current in) which, in this particular embodiment provides a total gain of about 50 K V/A. Filters 1305, 1335, and 1345 prevent interfering signals of the APD bias, the APD current monitor 1325, and the amplifier power supply 1340, from getting to the input of the very high gain amplifier chain 1320. The AC coupled amplifier chain has reduced gain at the typical DUT vibration frequencies (1 KHz and below) so that the noise on the amplified signal due to DUT vibration modulation is greatly reduced. The output, Vout, of the amplifier chain is sent to a high speed digitizer and is stored in memory for further analysis and display (not shown).

In any of the disclosed embodiments, it is advantageous to make the cutoff of the amplifier low, otherwise the low frequency component of the signal of interest would be almost completely attenuated. In an ideal situation, to capture the signal with good fidelity the response of the amplifier should extend down in frequency to the DC. However, in practice the reflected beam will carry a low frequency noise, mostly at about 10-200 Hz, due to DUT vibrations relative to the incident beam. The noise introduced by the DUT vibration can be very large as compared to the beam modulation, which is the signal of interest. Therefore, a cutoff in the amplifier's response should be introduced so as to remove this noise. The cutoff may be set at, say 100 KHz or below.

Figure 14:
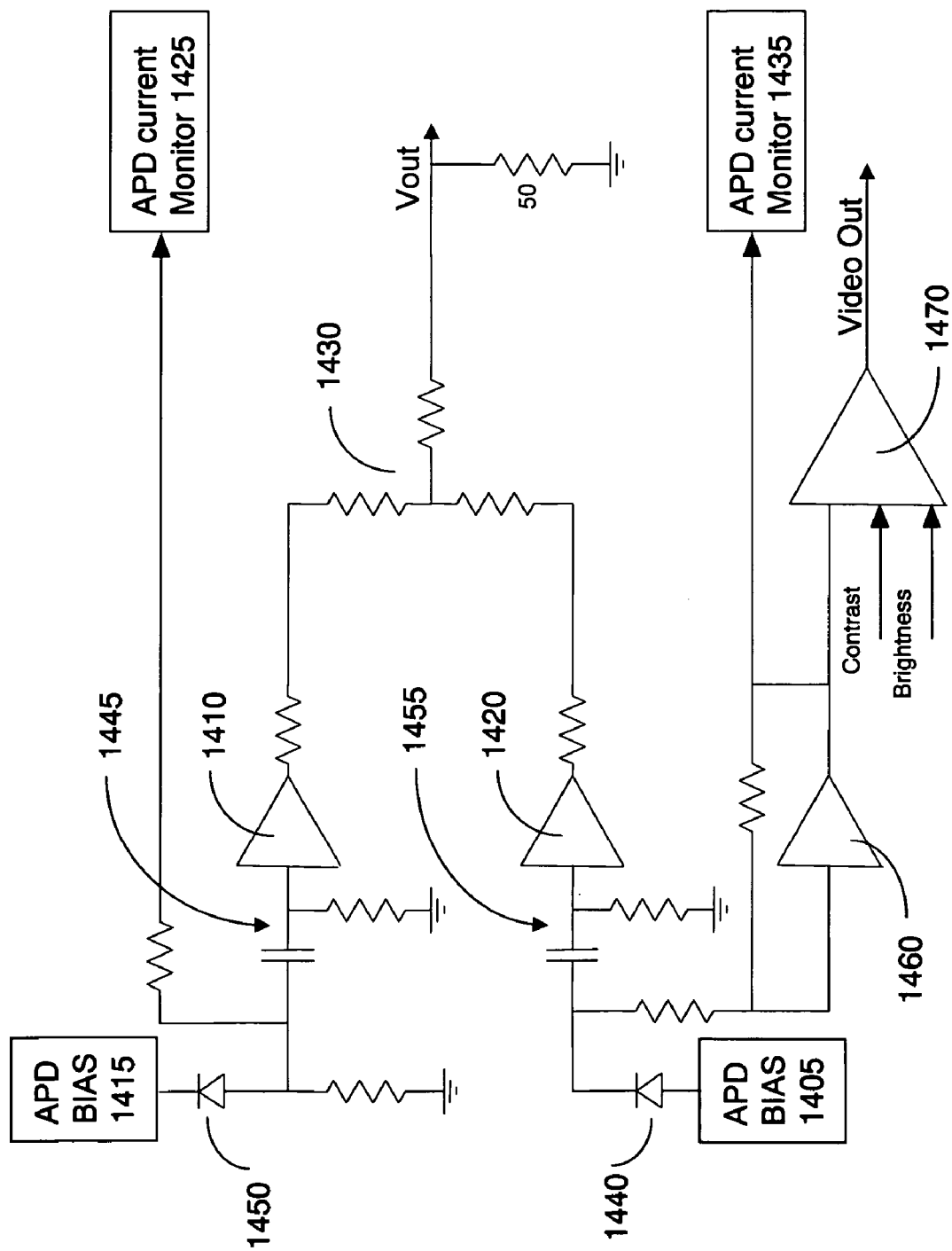
FIG. 14 depicts an embodiment of receiver electronics for a two photosensors, differential detection mode.

FIG. 14 depicts an embodiment of receiver electronics for a two photosensors, differential detection mode. For an increase in light intensity of the probing signal, two photodiodes are used in a differential detection mode. One diode produces a positive going signal at its amplifier input, while the other one produces a negative signal. Summing the two output signals produces an enhanced differential signal. As shown in FIG. 14, APD 1440 is negatively biased by APD bias 1405, and its current is monitored by current monitor 1435. In this embodiment, the bias is to about −60V. The other APD 1450 is positively biased by bias 1415 to approximately the same, but opposite value of bias 1405 (e.g., +60V), and its current is monitored by current monitor 1425. Monitoring the current of both APD's assists in checking the balance of the PDP optics, as the variable phase plate of the PDP can be adjusted until the same current is observed by the two current monitors 1425 and 1435.

The signal from APD 1440 is applied to amplifier 1420, while the signal from APD 1450 is applied to amplifier 1410. The output of both amplifiers are applied to a simple resistive summing junction 1430 to effectively add the two APD signals together and provide a probing signal Vout. The probing signal is sent to a digitizer for data storage and processing. In this embodiment filters 1445 and 1455 have been introduced to remove vibration and other noise appearing at below about 2 KHz.

During navigation, signal from only one APD is required to obtain an image of the DUT. As is shown, the signal from APD 1440 is also sent to amplifier 1460 and therefrom to video amplifier 1470, which provides a video out signal for processing and display. Other imaging methods may be performed with the resulting advantageous features as follows. In order to provide contrast control, the variable retarder may be varied to tune the retardation so that the image contrast is varied to the desired result. Additionally, imaging may be performed using both APD's and the resulting images subtracted from each other so as to obtain a difference image.

In the various embodiments disclosed where two APD's are used, the APD's gain may be advantageously controlled to, first, balance the APD's response and, second, to improve the imaging. Using a controllable variable power supply that is manually or automatically controlled, the voltage/gain response of each APD can be determined. Then, using the learned voltage/gain response, the gain of each APD can be controlled to a desired value by selecting the appropriate voltage on the corresponding power supply. For balancing the system, the following procedure may be used. First, the voltage of the power supplies of each APD is set to result in the same gain provided by both APD's, thereby balancing the output of the APD's. Then, the variable wave plate is adjusted until the current output of both ADP's is the same, thereby balancing the optical path. The variable gain can also be used for improved imaging. For example, when the image scan goes from a relatively dark area to a relatively bright area, the gain of the APD's may be reduced so as not to saturate the image. Conversely, when moving from a bright area to a dark area, the gain may be increased to provide improved contrast and detail.

As can be understood from the above, the PDP optics is advantageous over the prior art systems having a reference beam and a probing beam traversing two separate paths. However, any of these prior art system can be used with the inventive modulated laser so as to obtain the beneficial results of simplified and lower cost laser source, while probing a DUT at a frequency higher than the bandwidth capacity of the photosensor used.

Figure 15:
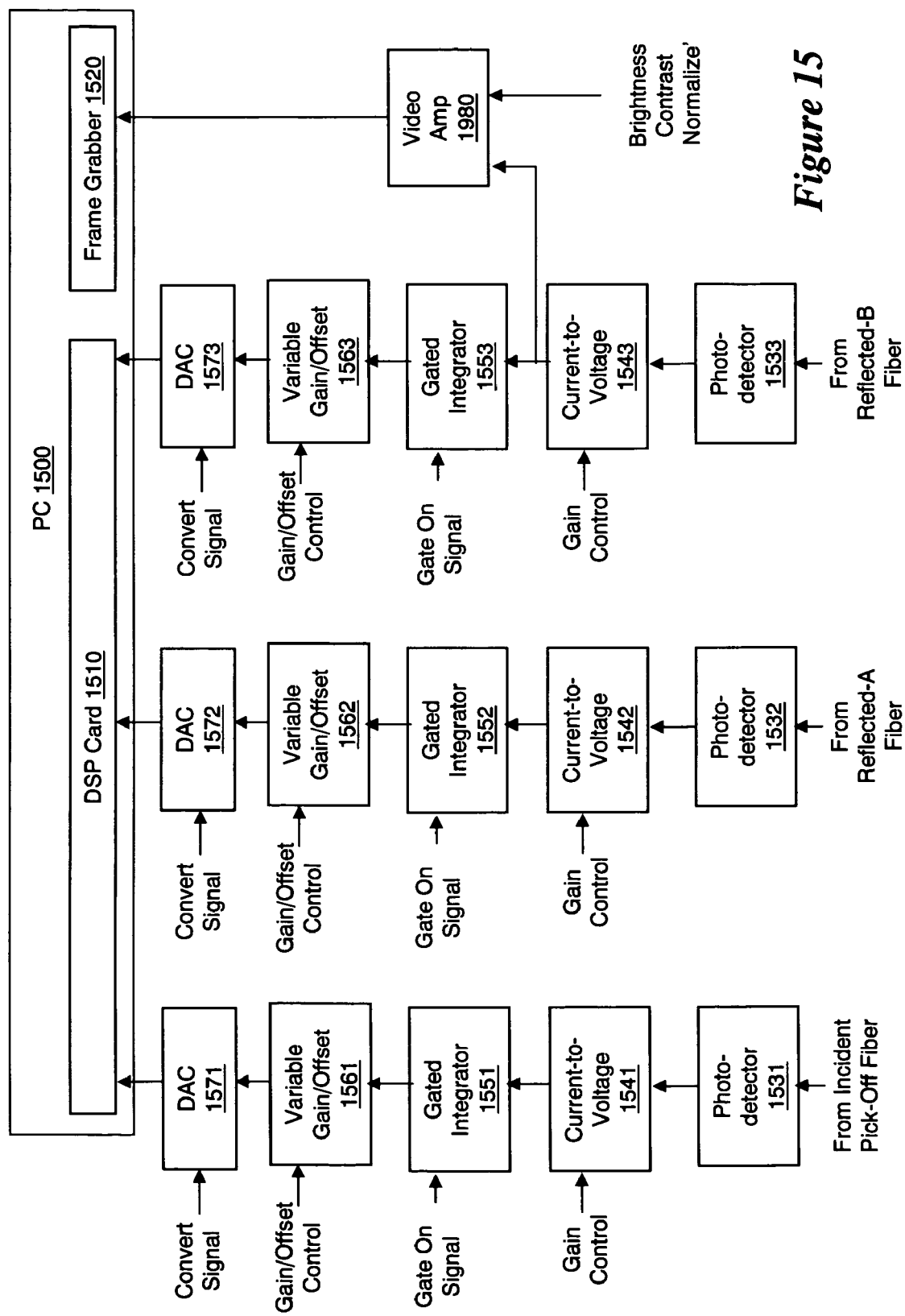
FIG. 15 depicts a block diagram of another scheme where signals are not summed or differenced in analog form, but digitized individually.

FIG. 15 shows block diagram of another scheme where signals are not summed in analog, but digitized individually. This allows the signals to be summed, subtracted, divided, etc. This arrangement does not require the exquisite balancing necessary for analog subtraction to work. It also gives greater flexibility. For example, the ratio of reflected A/reflected B gives pure PDP signal, but this arrangement also enables other ratios, such as reflected A/Incident pick-off and/or reflected B/Incident pick-off simultaneously. The user may try various signals and then chose which provides the best result for a particular investigation.

In the embodiment of FIG. 15, a computer, such as a programmed personal computer PC 1500 is equipped with a digital signal processing card DSP 1510 and a frame grabber 1520. In this embodiment, three channels, CH1, CH2, and CH3, provide signals to the DSP 1510. In this embodiment the three channels comprise the same elements, so the description proceeds with describing only channel CH1. Channel CH1 comprises photosensor 1531 which receives a light signal from a fiber optics and outputs an electrical signal. The electrical output of the photosensor 1531 is applied to current to voltage converter 1541 which has variable transimpedance gain control. The output of the current to voltage converter is then applied to a gated integrator 1551, which is responsive to a gate on signal. The signal from the gated integrator 1551 is applied to a variable gain/offset circuit 1561 to enable gain/offset control. The signal from the gain/offset circuitry 1561 is then applied to a digital/analog converter DAC 1571 to convert the analog signal into a digital signal. Variable gain/offset circuit 1561 allows signal applied to DAC 1571 to be within the input range of the DAC. In this embodiment, a 14 bit DAC converter with internal sample/hold feature is used. The digital output is then provided to the DSP card for processing.

As is shown in FIG. 15, channel CH1 is used to monitor the output of the laser source and it receives the signal from the pick-off fiber as explained above. Channels CH2 and CH3, on the other hand, are used for the probing and receive the reflected signals Reflected-A and Reflected-B, respectively. Additionally, one of the channels, in this illustration channel CH3 is also used for imaging by applying the output of its current to voltage converter to a video amplifier 1580, the output of which is applied to the frame grabber 1520. The quality of the image may be adjusted by a brightness/contrast (or black level/gain) signal applied to the video amplifier.

Figure 16:
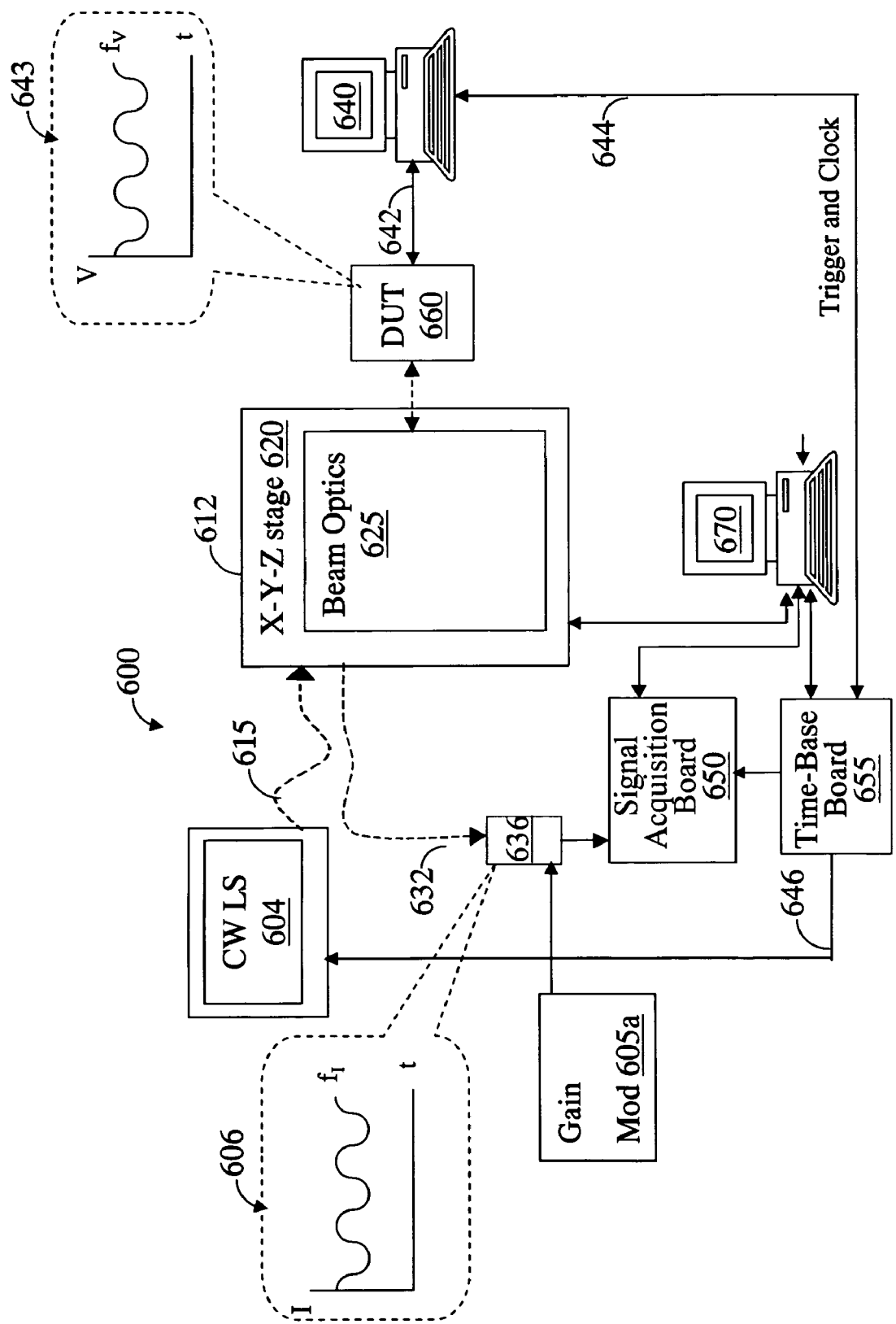
FIG. 16 depicts an alternative embodiment using CW laser and modulated bias for the sensor.

As can be understood from the above description, the various embodiments described so far are based on modulating the intensity of the probing CW laser at some frequency and then looking at the reflected beam for the low frequency beat frequency between this modulation and the signal on the DUT. A similar effect, i.e., a low frequency beat signal can be obtained by using an unmodulated CW laser beam, but modulating the gain of the detector instead. This is shown by the embodiment of FIG. 16. In FIG. 16, a continuous wave laser source CW LS 604 is used to provide laser beam into fiber optics 615. The optical bench 612 with its beam optics 625 and stage 620 remain the same as in the other embodiments shown above, such as that of FIG. 6. However, the gain of APD 636 is modulated by gain modulator 605a, as illustrated by callout 606. For example, Gaid modulator 605a varies the bias voltage on the APD 636. Consequently, the output of APD 636 would have a component of the low frequency beat between the DUT signal and the gain modulation signal.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed is:

1. A system for testing an integrated circuit microchip using laser probing, comprising:
   a laser source providing a laser beam;
   a modulator for imparting modulation to said laser beam;
   a beam optics receiving said laser beam and focusing said laser beam onto a selected spot on said microchip;
   a photosensor receiving reflected laser light that is reflected from said microchip and providing an electrical signal;
   collection electronics receiving the electrical signal from said photosensor and providing an output signal;
   an analysis system receiving and analyzing said output signal;
   wherein said microchip perturbs said laser beam and wherein said analysis system deciphers perturbations in said laser beam by detecting beat frequency between an operation frequency of said microchip and a frequency of the laser beam modulation; and,
   wherein said photosensor comprises an avalanche photodiode.

2. The system of claim 1, wherein said laser source is a tunable laser source.

3. The system of claim 2, wherein said modulator impart modulation to said laser beam by modulating said tunable laser source.

4. The system of claim 1, wherein said laser source is a CW laser source.

5. The system of claim 4, wherein said modulator impart modulation to said laser beam by optically modulating said laser beam.

6. The system of claim 1, wherein said microchip is operable at a defined frequency and wherein said modulator causes said laser beam to modulate at said defined frequency.

7. The system of claim 6, wherein said modulator causes said laser beam to modulate in phase with said microchip.

8. The system of claim 6, wherein said modulator causes said laser beam to modulate out of phase with said microchip.

9. The system of claim 6, wherein said photosensor has a defined bandwidth and said defined frequency is higher than the defined bandwidth.

10. A system for testing an integrated circuit microchip using laser probing, comprising:
    a laser source providing a laser beam;
    a modulator for imparting modulation to said laser beam;
    a beam optics receiving said laser beam and focusing said laser beam onto a selected spot on said microchip;
    a photosensor receiving reflected laser light that is reflected from said microchip and providing an electrical signal;
    collection electronics receiving the electrical signal from said photosensor and providing an output signal;
    an analysis system receiving and analyzing said output signal; and,
    wherein said beam optics comprises a laser scanning microscope (LSM).

11. The system of claim 10, wherein said LSM is operable in a scanning mode and in a beam pointing mode.

12. The system of claim 10, wherein said beam optics comprises a first polarizer beam splitter positioned upstream of said Faraday rotator and a second polarized beam splitter positioned between said Faraday Rotator and said optical retarder.

13. The system of claim 12, further comprising a second photosensor receiving light deflected from said second polarized beam splitter.

14. The system of claim 13, wherein said beam optics further comprises a solid immersion lens.

15. The system of claim 13, wherein said photosensor and said second photosensor comprise first and second avalanche photodiodes (APD's), respectively.

16. The system of claim 15, wherein said first and second APD's are coupled to a controllable variable power supply.

17. The system of claim 16, further comprising a first and second current monitors coupled to said first and second APD's, respectively.

18. The system of claim 17, further comprising a video amplifier coupled to at least one of said first and second APD's.

19. The system of claim 15, further comprising a signal amplifier system providing an amplified electrical signal corresponding to output signals of said first and second APD's.

20. A system for testing an integrated circuit microchip using laser probing, comprising:
    a laser source providing a laser beam;
    a modulator for imparting modulation to said laser beam;
    a beam optics receiving said laser beam and focusing said laser beam onto a selected spot on said microchip;
    a photosensor receiving reflected laser light that is reflected from said microchip and providing an electrical signal;
    collection electronics receiving the electrical signal from said photosensor and providing an output signal;
    an analysis system receiving and analyzing said output signal; and,
    wherein said modulator causes the intensity of said laser beam to be modulated in a form of a sine wave.

21. The system of claim 20, wherein said sine wave is of a frequency equivalent to operation frequency of said microchip.

22. A method for probing an integrated circuit microchip operable at a defined frequency and phase, comprising:
    generating a modular laser beam:
    pointing said modulated laser beam onto a selected area of said microchip:
    collecting reflected beam reflected from the area of said microchip;

analyzing said reflected beam to decipher perturbation cause by said microchip by detecting beat frequency between operation frequency of said microchip and frequency of the modulated laser beam; and wherein said generating a modulated laser beam comprises generating sinusoidal-shaped modulated laser beam.

23. The method of claim 22, wherein said sinusoidal-shaped modulated laser beam is generated at a frequency equivalent to the operational frequency of said microchip.

24. The system of claim 22, wherein said generating a modulated laser beam comprises generating a CW laser beam and modulating the intensity of said CW laser beam.

25. A method of claim 22, wherein said generating a modulated laser beam comprises applying a modulator to a tunable laser source.

26. A system for testing an integrated circuit microchip using laser probing, comprising:
 a laser source providing a continuous laser beam;
 a beam optics receiving said laser beam and focusing said laser beam onto a selected spot on said microchip;
 a photosensor receiving reflected laser light that is reflected from said microchip and providing an electrical signal;
 a modulator for modulating said photosensor;
 collection electronics receiving the electrical signal from said photosensor and providing an output signal;
 an analysis system receiving and analyzing said output signal.

27. The system of claim 26, wherein said photosensor is an APD and said modulator modulates the gain of said APD.

28. The system of claim 27, wherein said microchip is operable at a defined frequency and wherein said modulator modulates the gain of said APD at said defined frequency.

29. The system of claim 27, wherein said modulator modulates the gain of said APD in phase with said microchip.

30. The system of claim 27, wherein said modulator modulates the gain of said APD out of phase with said microchip.

31. The system of claim 28, wherein said APD has a defined bandwidth and said defined frequency is higher than the defined bandwidth.

32. The system of claim 27, wherein said microchip perturbs said laser beam and wherein said analysis system deciphers perturbations in said laser beam by detecting beat frequency between operation frequency of said microchip and frequency of the APD gain modulation.

* * * * *